(12) United States Patent
Masuoka et al.

(10) Patent No.: US 9,640,637 B2
(45) Date of Patent: May 2, 2017

(54) METHOD FOR PRODUCING SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SIGNAPORE PTE. LTD., Singapore (SG)

( * ) Notice: Subject to any disclaimer, the term of this patent is extended or adjusted under 35 U.S.C. 154(b) by 0 days.

(21) Appl. No.: 15/336,972

(22) Filed: Oct. 28, 2016

(65) Prior Publication Data

US 2017/0047428 A1 Feb. 16, 2017

Related U.S. Application Data

(60) Division of application No. 14/847,510, filed on Sep. 8, 2015, now Pat. No. 9,520,473, which is a
(Continued)

(51) Int. Cl.
*H01L 29/423* (2006.01)
*H01L 29/66* (2006.01)
*H01L 29/78* (2006.01)

(52) U.S. Cl.
CPC .. *H01L 29/66666* (2013.01); *H01L 29/42356* (2013.01); *H01L 29/66545* (2013.01); *H01L 29/7827* (2013.01)

(58) Field of Classification Search
CPC ....... H01L 21/823487; H01L 29/42356; H01L 29/66545; H01L 29/66666; H01L 29/78;
(Continued)

(56) References Cited

U.S. PATENT DOCUMENTS 6,891,234 B1 5/2005 Connelly et al.
2007/0148939 A1* 6/2007 Chu .............. H01L 21/823807
438/590
(Continued)

FOREIGN PATENT DOCUMENTS

JP H02-071556 A 3/1990
JP H02-188966 A 7/1990
(Continued)

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
(Continued)

*Primary Examiner* — Jarrett Stark
*Assistant Examiner* — Shahed Ahmed
(74) *Attorney, Agent, or Firm* — Brinks Gilson & Lione

(57) ABSTRACT

A method for producing a semiconductor device includes a first step of forming a first insulating film around a fin-shaped semiconductor layer; a second step of forming a first pillar-shaped semiconductor layer, a first dummy gate, a second pillar-shaped semiconductor layer, and a second dummy gate; a third step of forming a third dummy gate and a fourth dummy gate; a fourth step of forming a third diffusion layer in an upper portion of the fin-shaped semiconductor layer, in a lower portion of the first pillar-shaped semiconductor layer, and in a lower portion of the second pillar-shaped semiconductor layer; a fifth step of forming a gate electrode and a gate line around the first pillar-shaped semiconductor layer and forming a contact electrode and a contact line around the second pillar-shaped semiconductor layer; and a sixth step of forming first to fifth contacts.

6 Claims, 41 Drawing Sheets

Related U.S. Application Data continuation of application No. PCT/JP2013/071355, filed on Aug. 7, 2013.

(58) Field of Classification Search
CPC ............. H01L 29/7827; H01L 27/0886; H01L 27/10826; H01L 29/41791
USPC ........ 257/288, 328, 368, 369; 438/151, 156, 438/173, 197, 199, 206
See application file for complete search history.

(56) References Cited

U.S. PATENT DOCUMENTS

| | | | |
|---|---|---|---|
| 2009/0242972 | A1 | 10/2009 | Cho |
| 2010/0320530 | A1 | 12/2010 | Cheng |
| 2011/0062523 | A1* | 3/2011 | Masuoka ........ H01L 21/823814 257/368 |
| 2011/0062552 | A1 | 3/2011 | Tsuchiya |
| 2011/0241122 | A1* | 10/2011 | Masuoka ................ H01L 27/11 257/369 |

FOREIGN PATENT DOCUMENTS

| | | |
|---|---|---|
| JP | H03-145761 A | 6/1991 |
| JP | 11-297984 A | 10/1999 |
| JP | 2004-356314 A | 12/2004 |
| JP | 2009-182317 A | 8/2009 |
| JP | 2011-061067 A | 3/2011 |
| WO | WO 2012/077178 A1 | 6/2012 |
| WO | WO 2013/093988 A1 | 6/2013 |

OTHER PUBLICATIONS

Wu et al., "High Performance 22/20nm FinFET CMOS Devices with Advanced High-K/Metal Gate Scheme", IEEE, pp. 27.1.1-27.1.4, 2010.

International Search Report and Written Opinion with English Translation for PCT/JP2013/071355 dated Oct. 22, 2013, 9 pages.

International Preliminary Report on Patentability (English language translation), in corresponding International Application No. PCT/JP2013/071355, dated Feb. 18, 2016, 7 pages.

Office Action in corresponding U.S. Appl. No. 14/847,510, dated May 3, 2016, 10 pages Notice of Allowance in corresponding U.S. Appl. No. 14/847,510, dated Sep. 21, 2016, 8 pages.

* cited by examiner

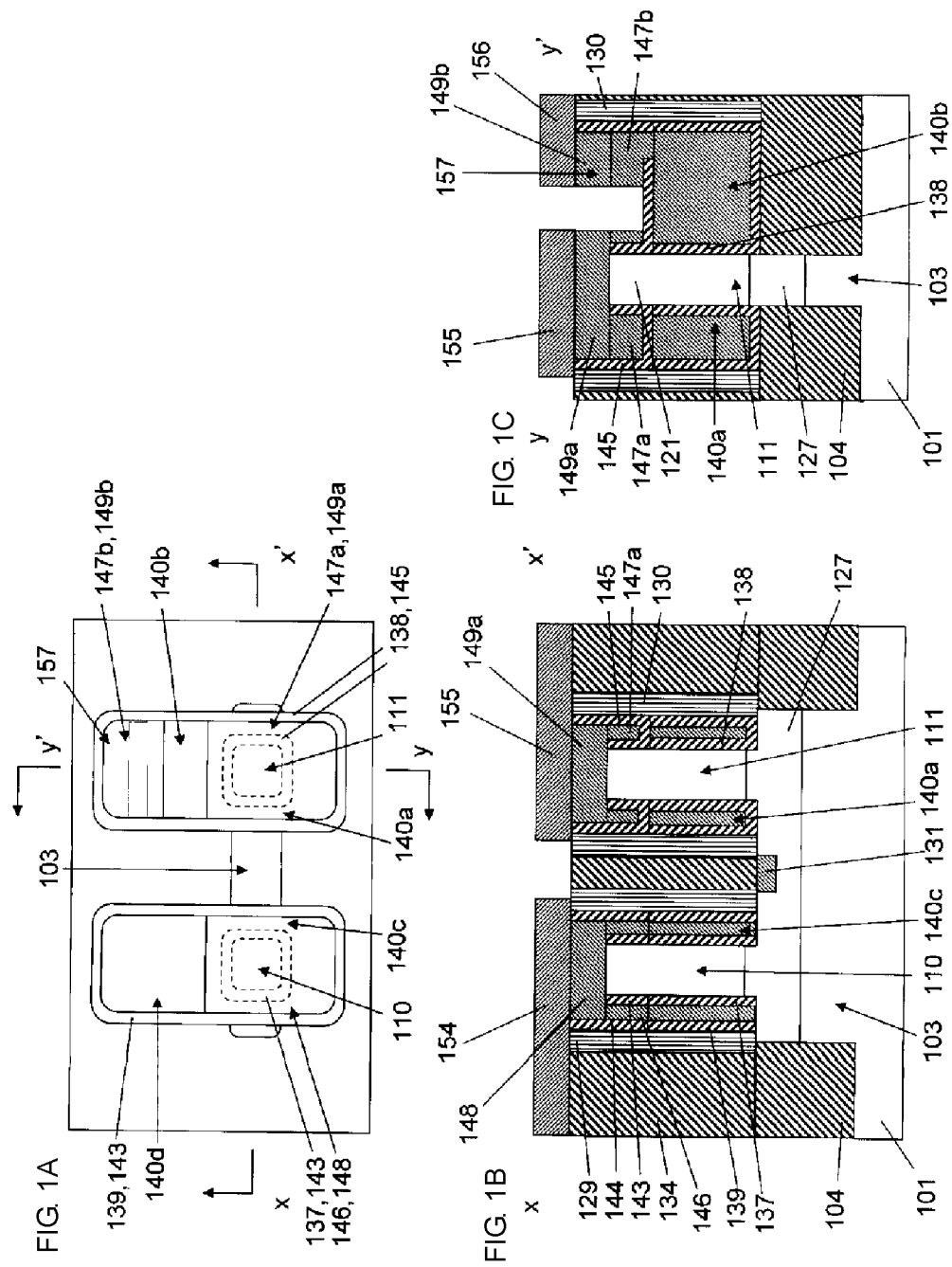

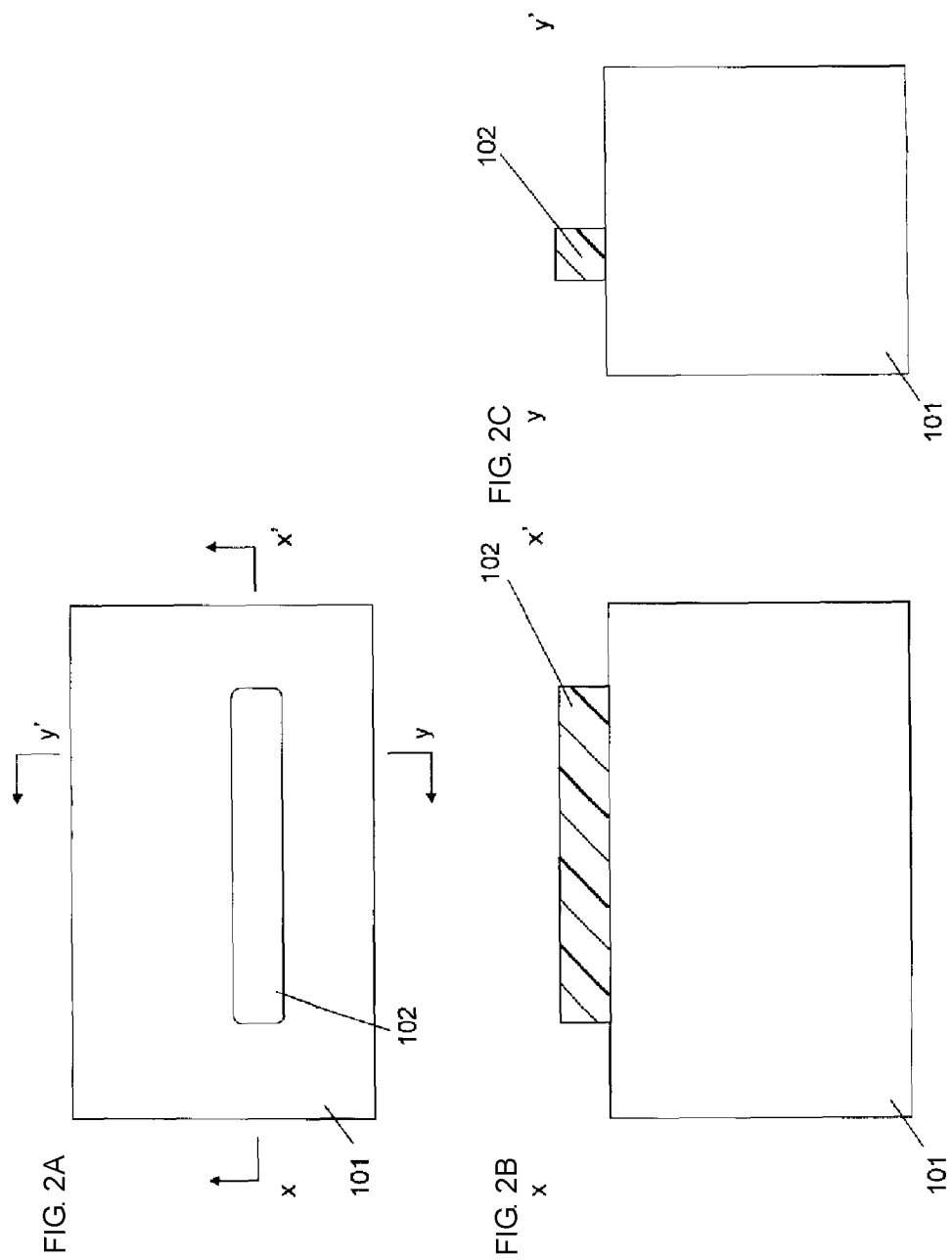

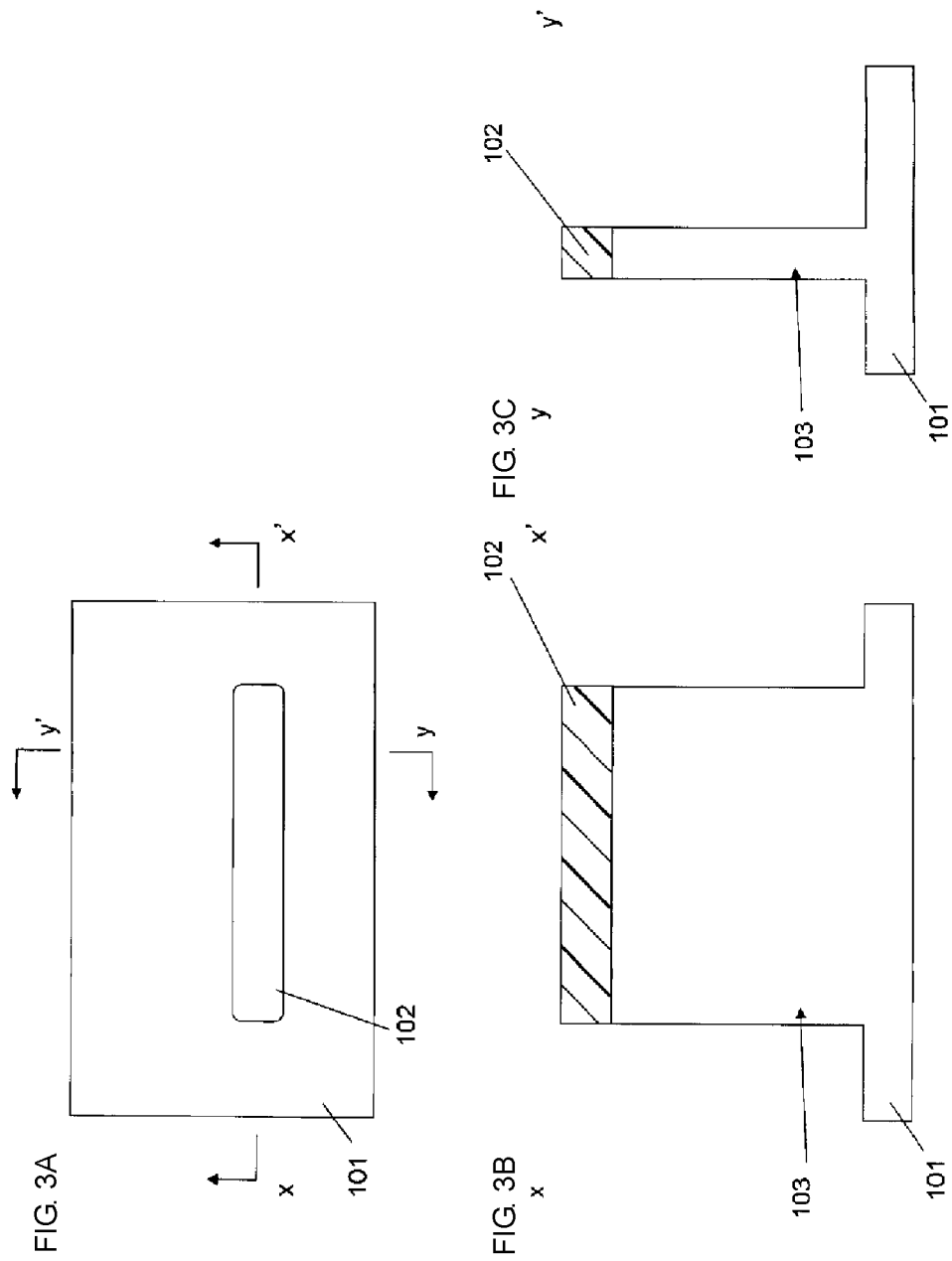

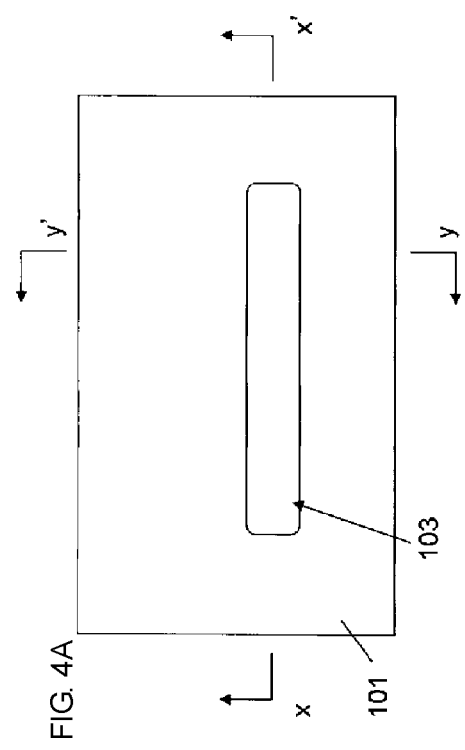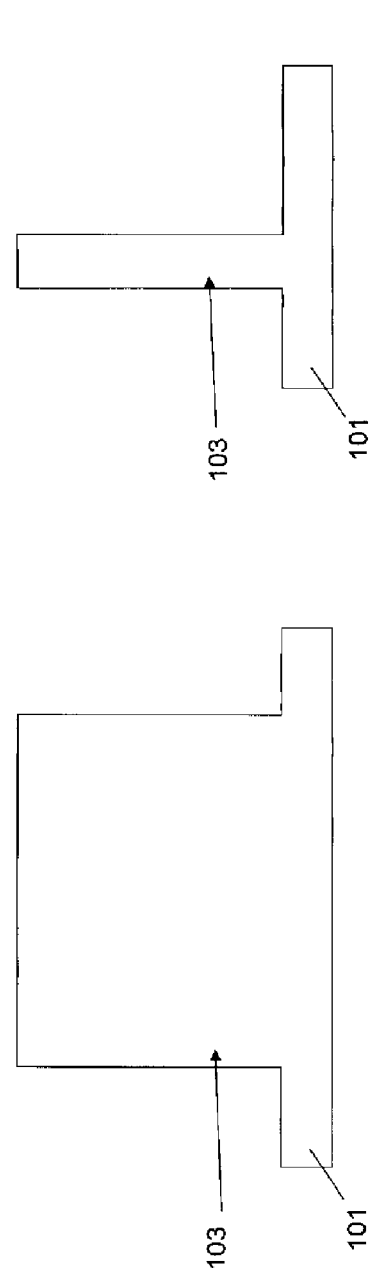

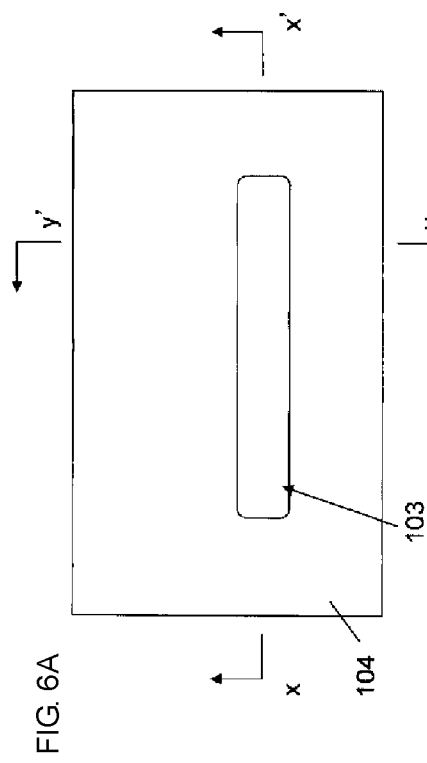
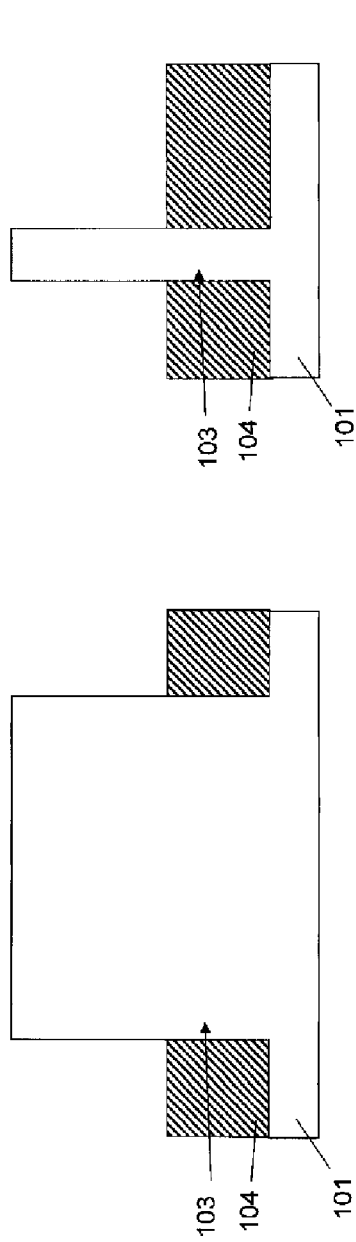
FIG. 6A
FIG. 6B
FIG. 6C

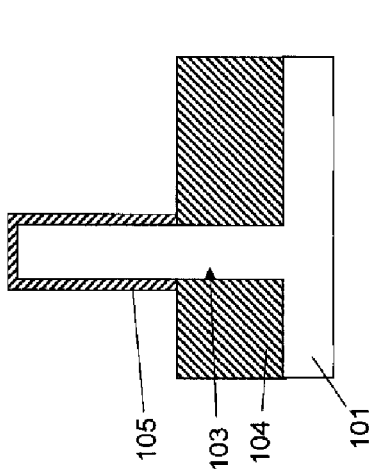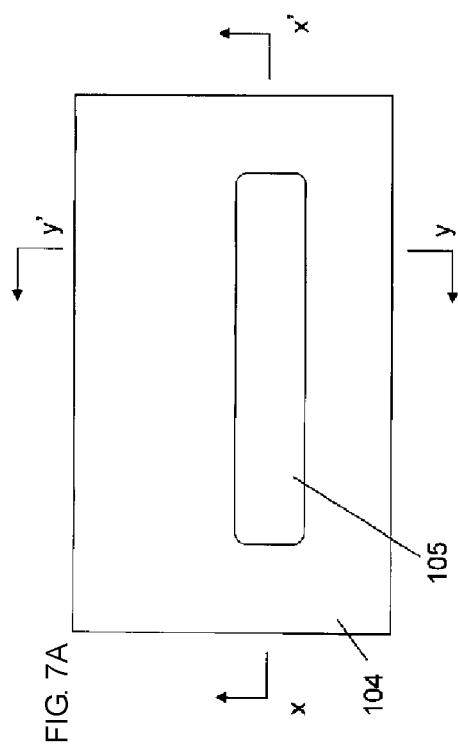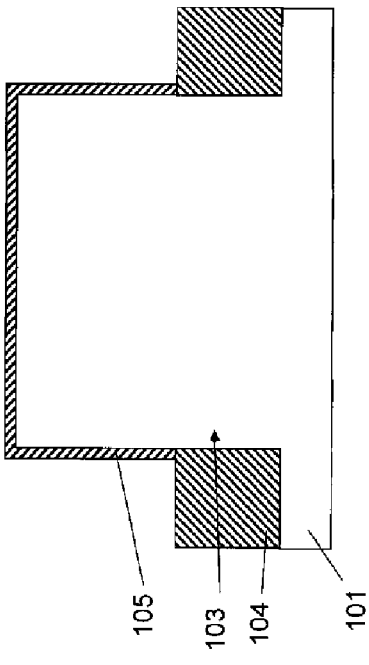
FIG. 7A
FIG. 7B
FIG. 7C

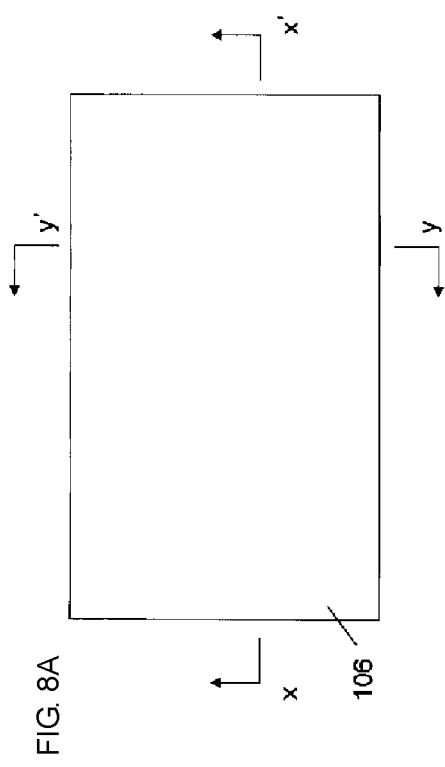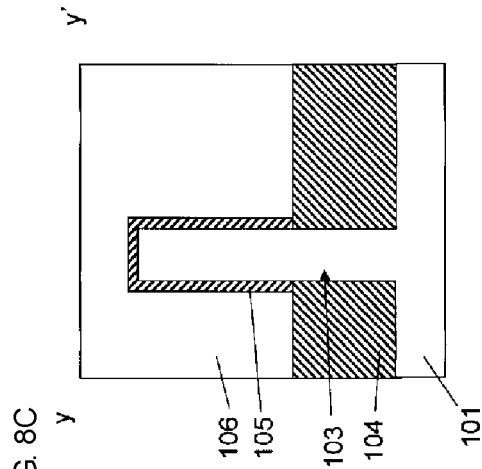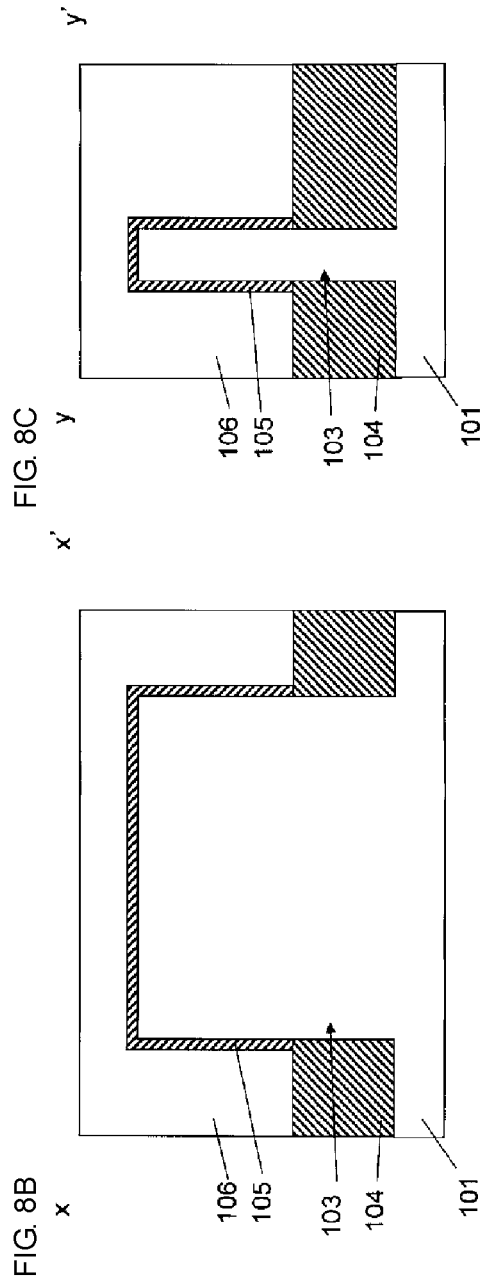

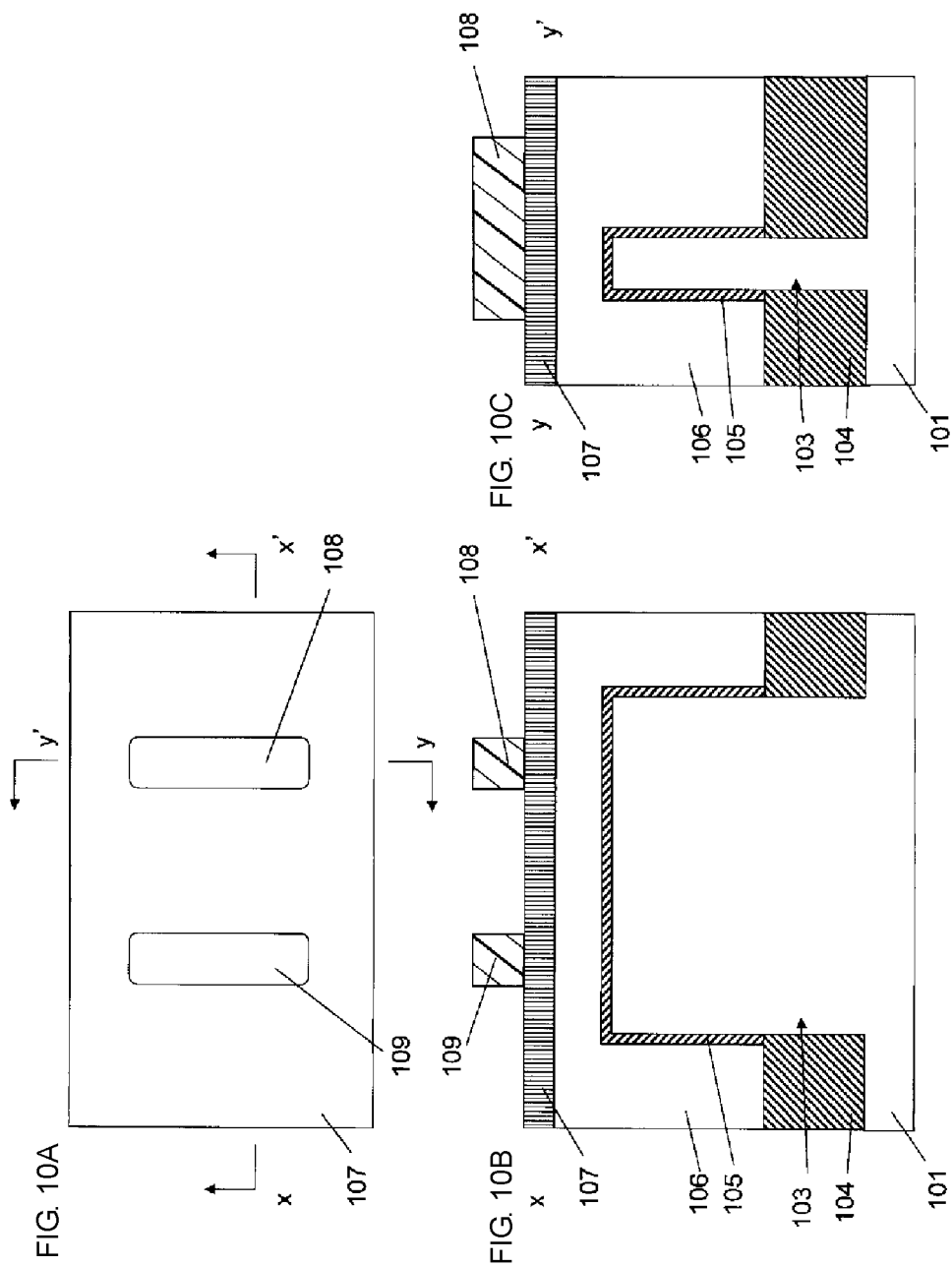

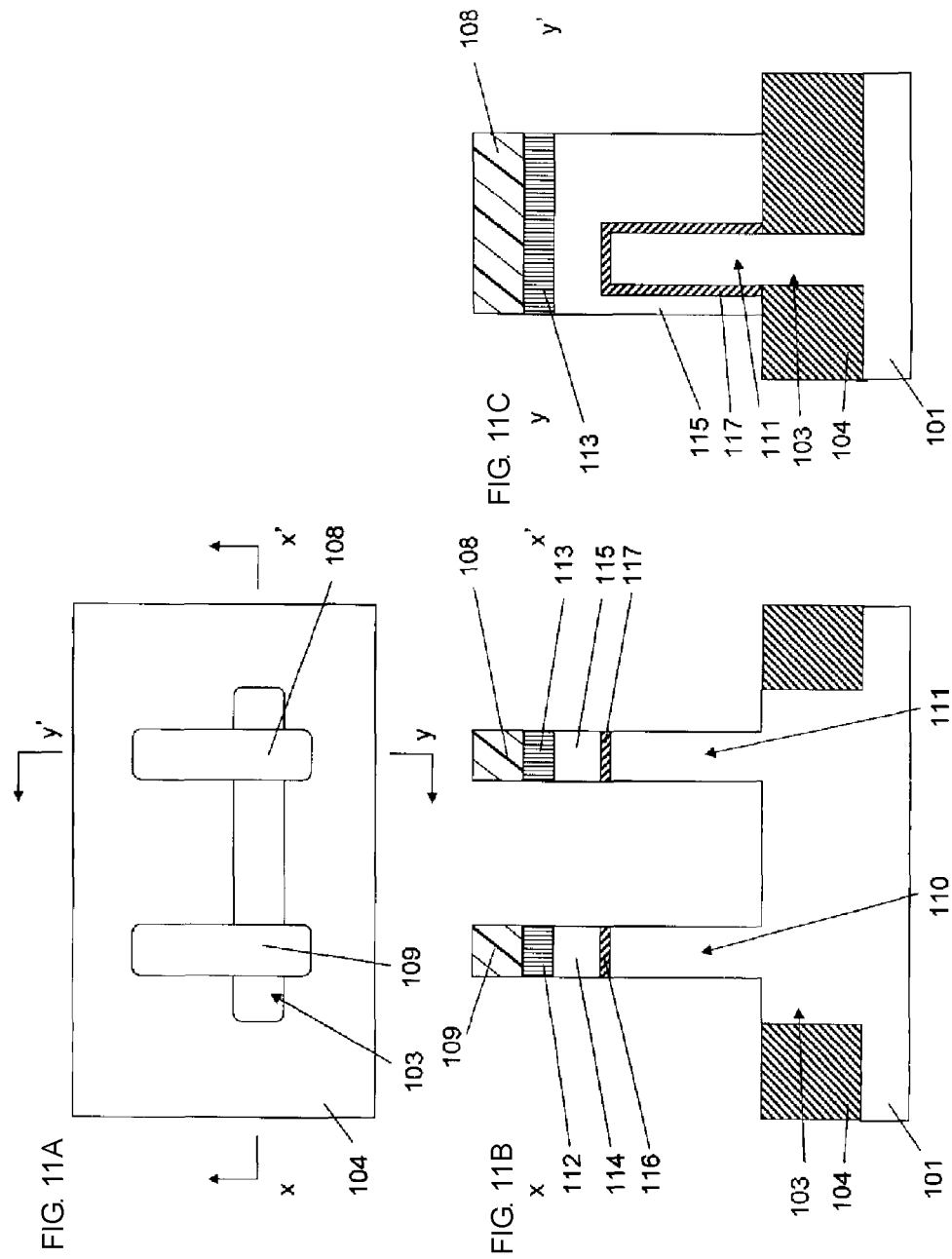

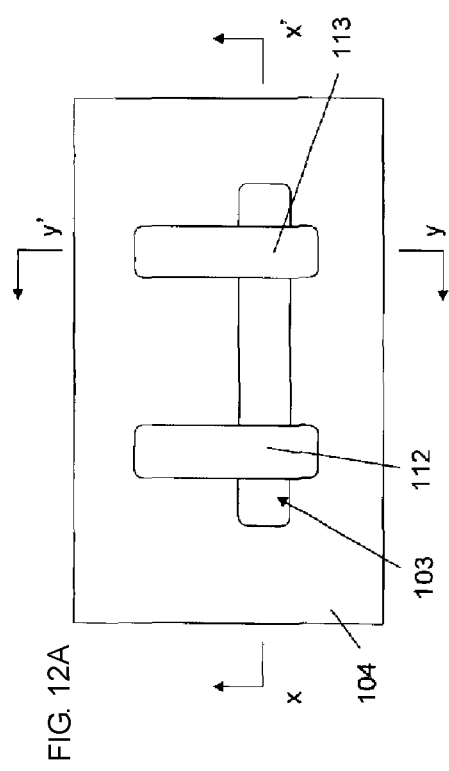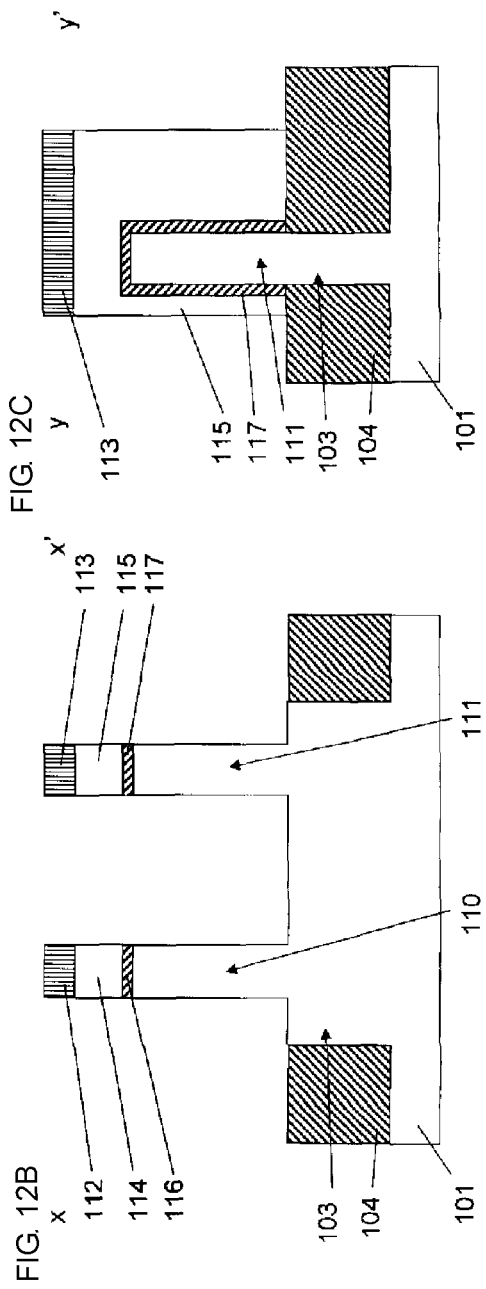

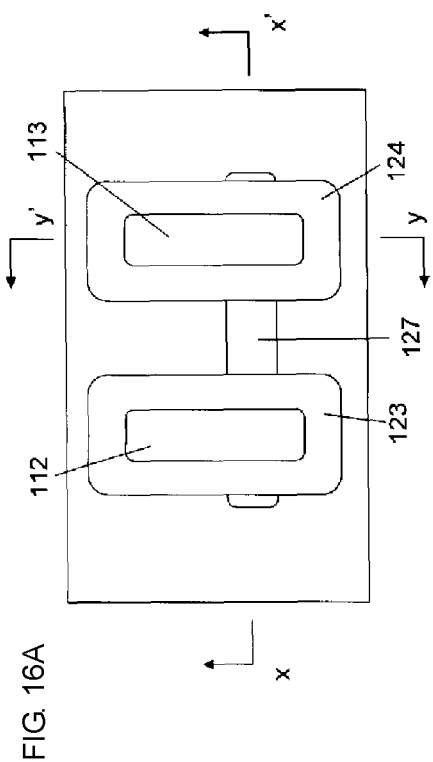
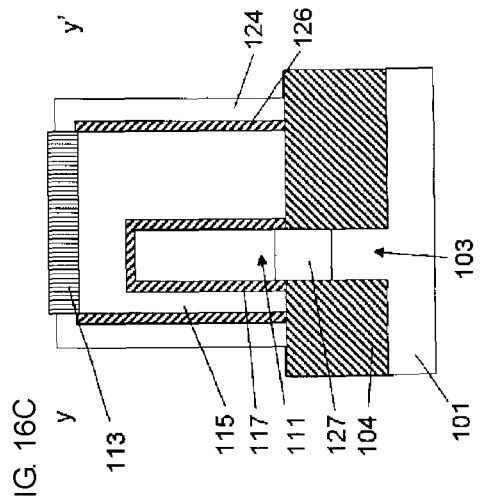
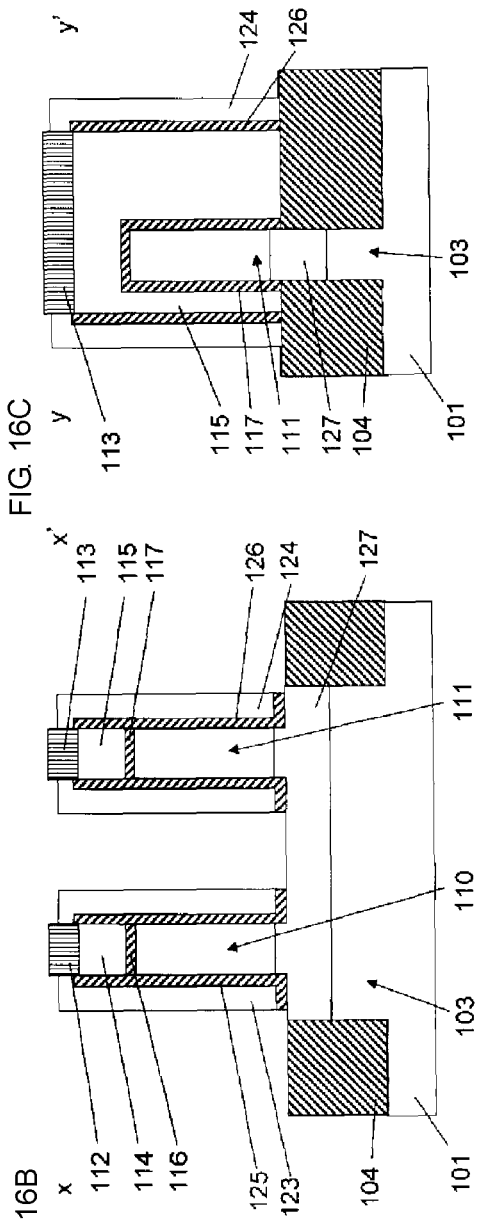
FIG. 16A
FIG. 16B
FIG. 16C

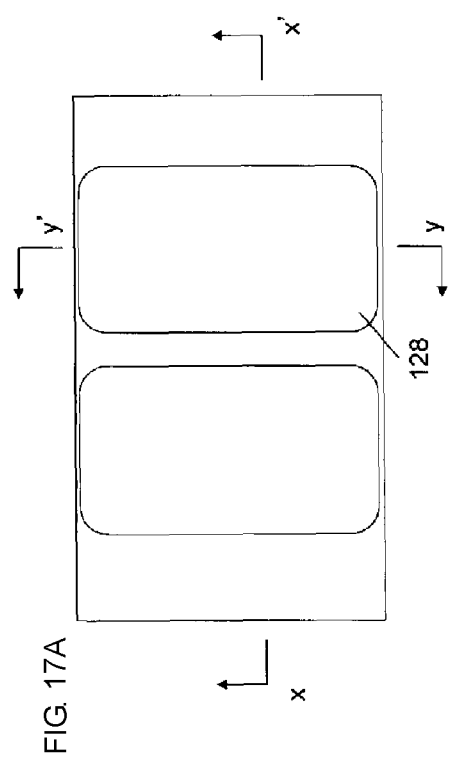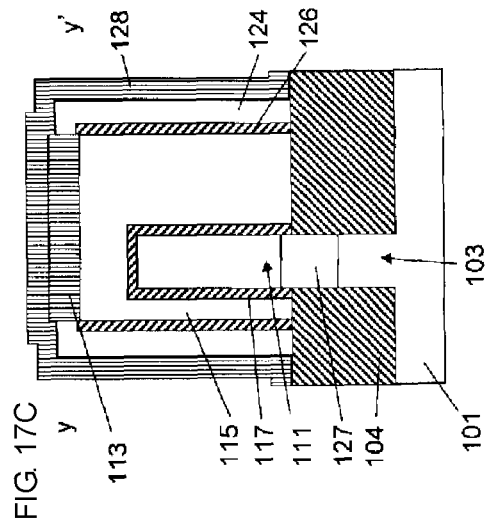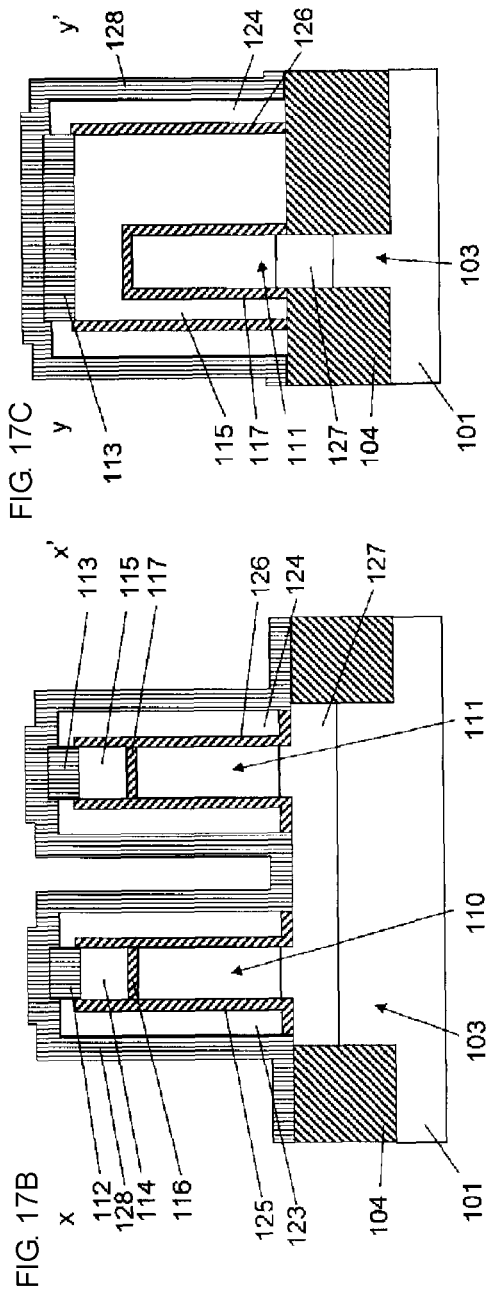

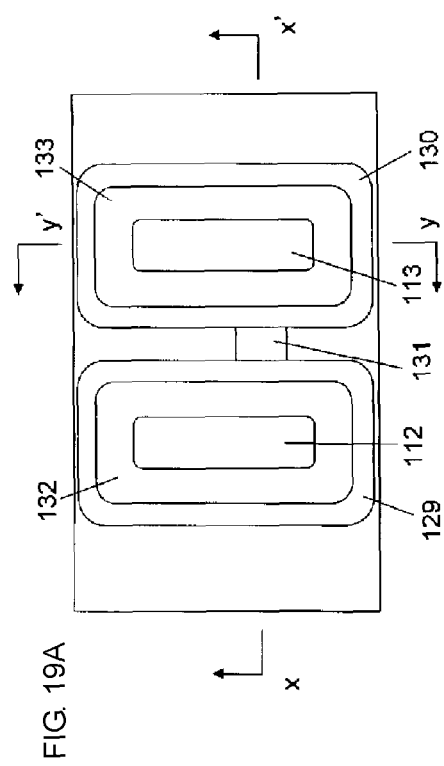
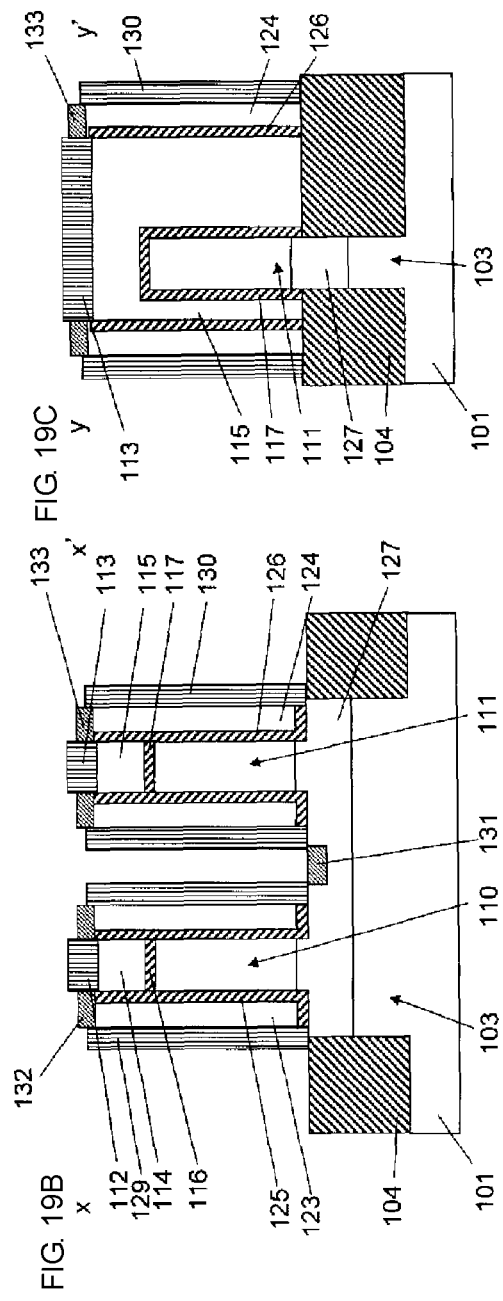

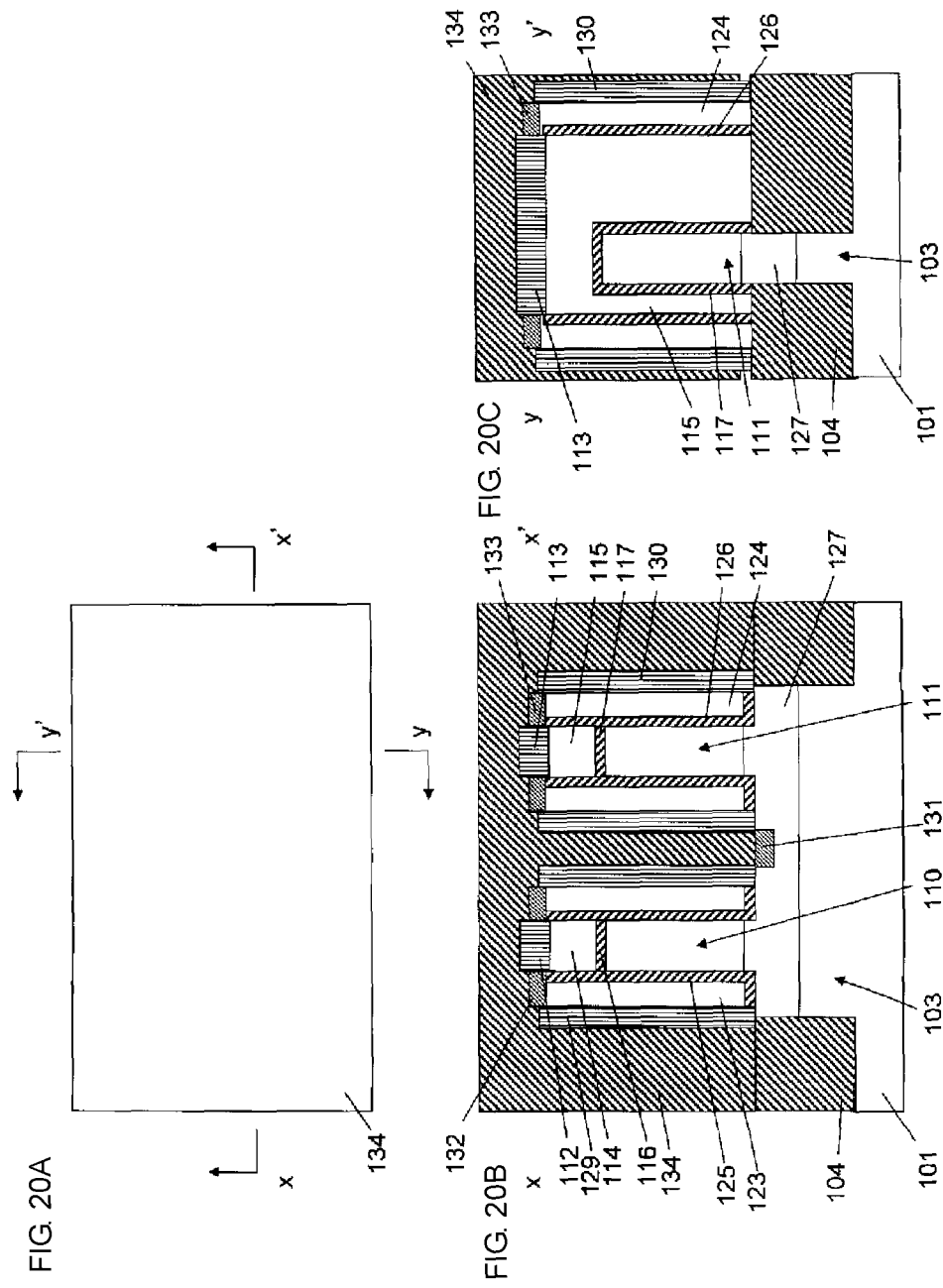

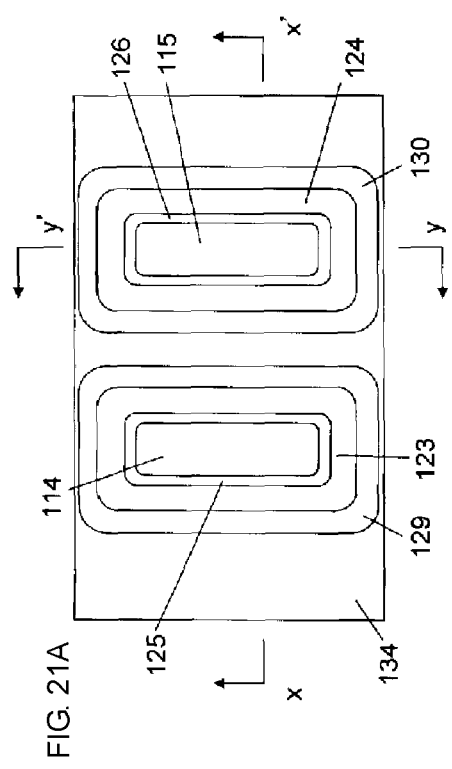
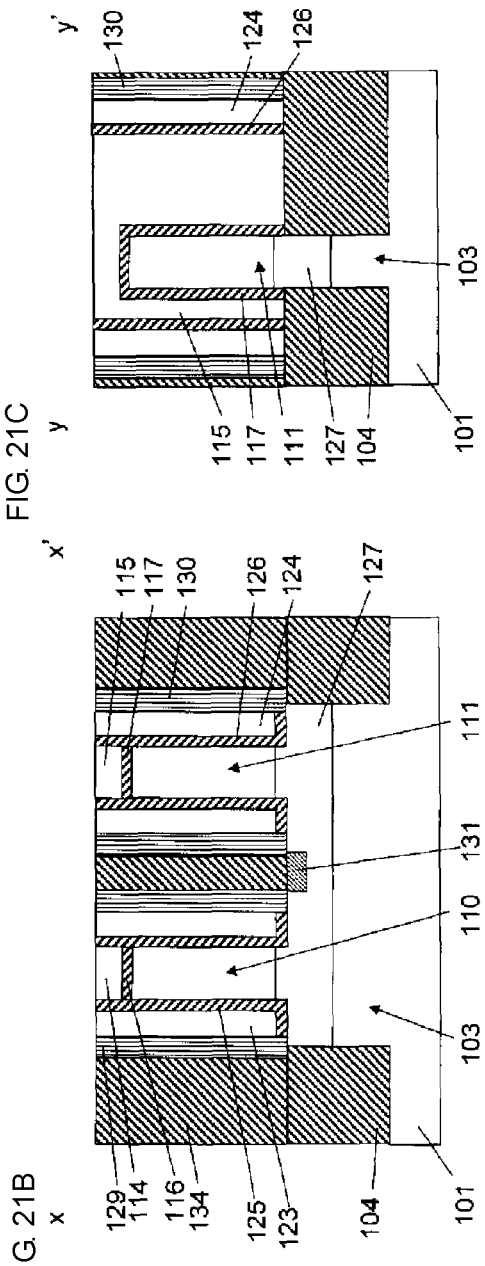

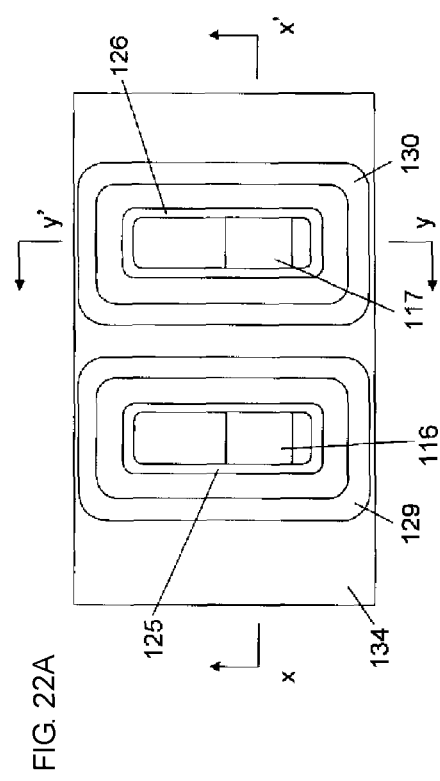
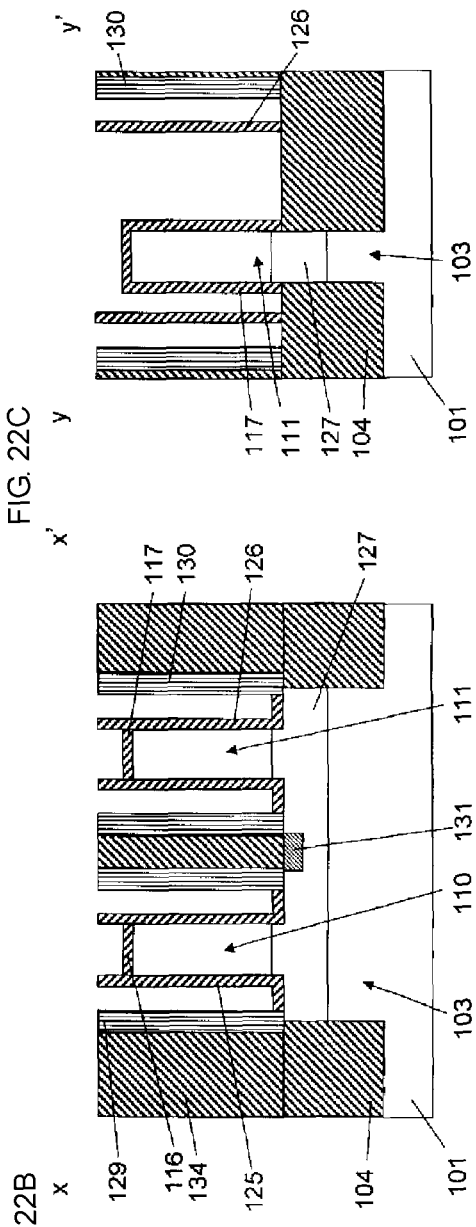
FIG. 22A
FIG. 22B
FIG. 22C

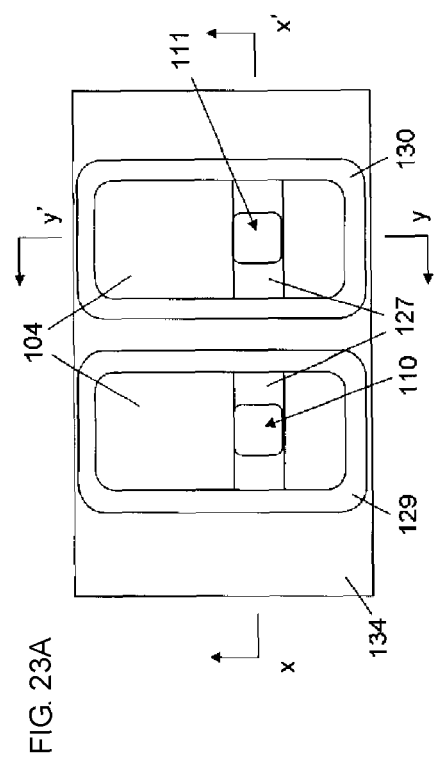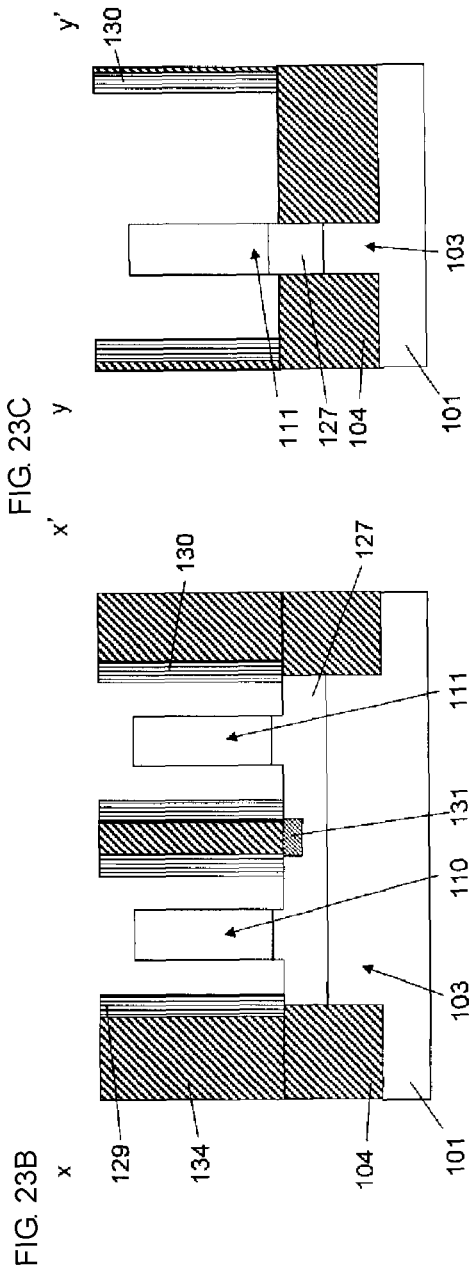
FIG. 23A
FIG. 23B
FIG. 23C

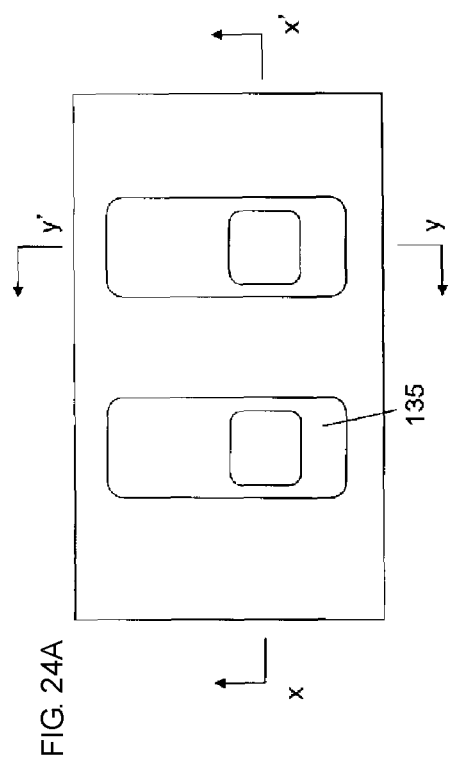
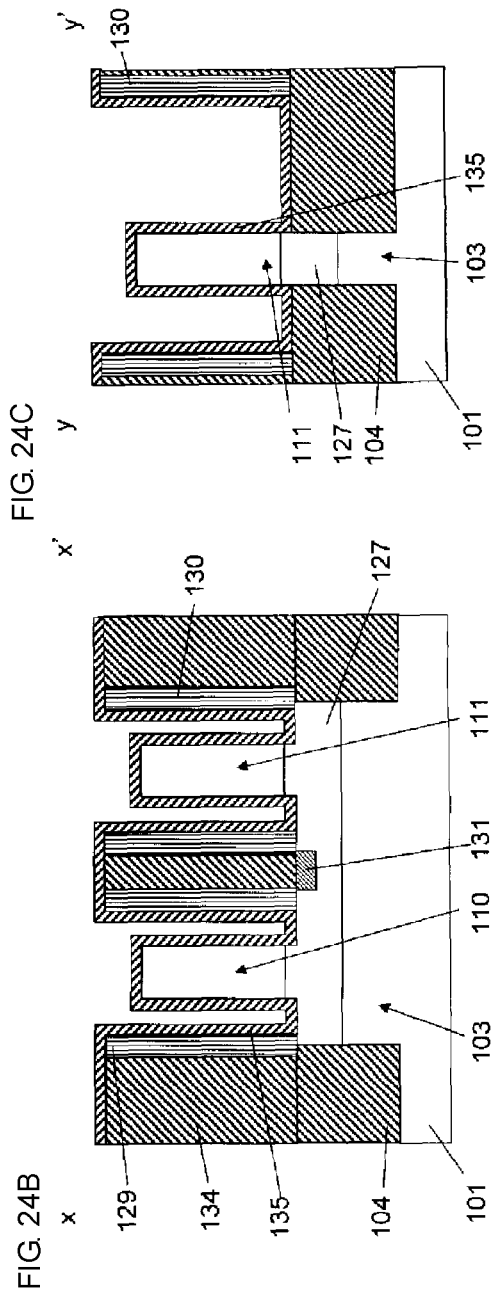
FIG. 24A
FIG. 24B
FIG. 24C

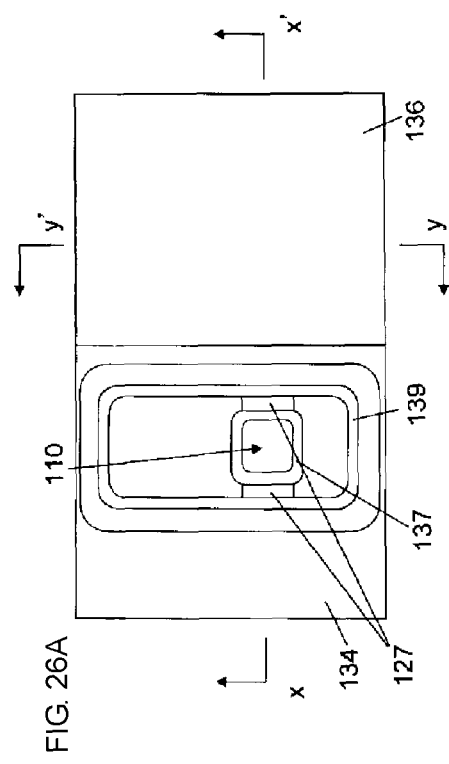
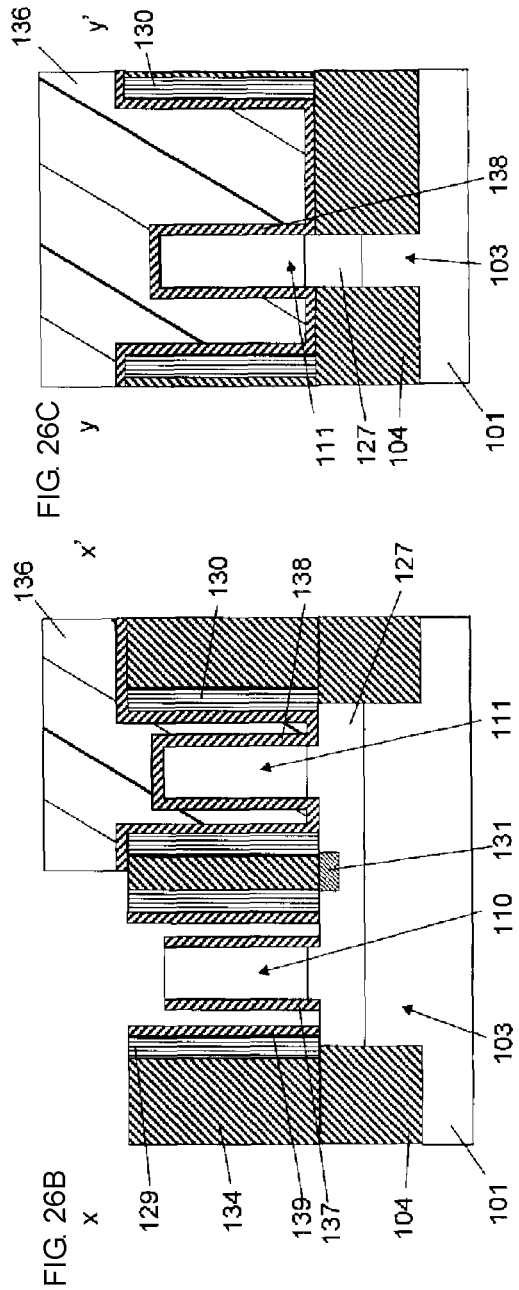
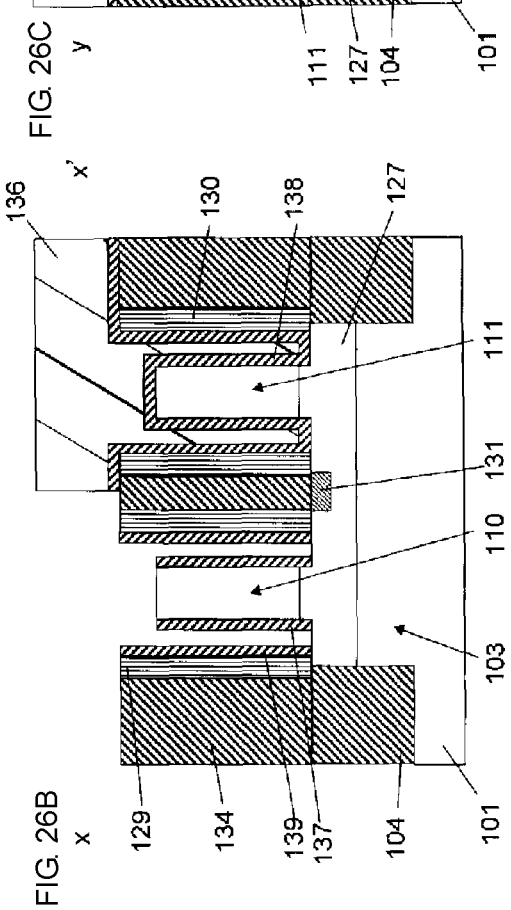

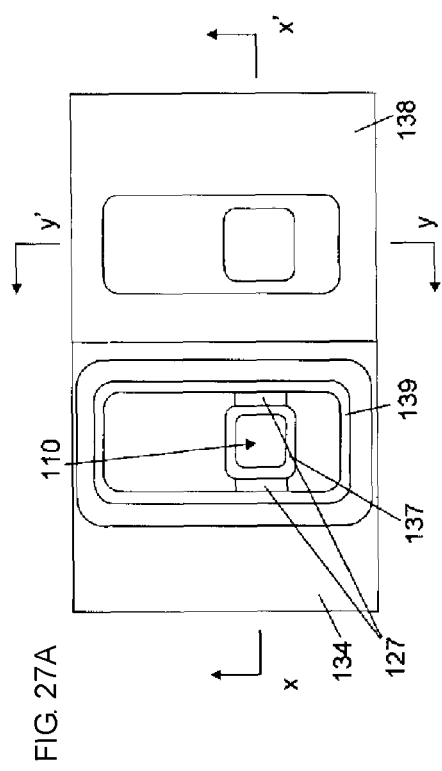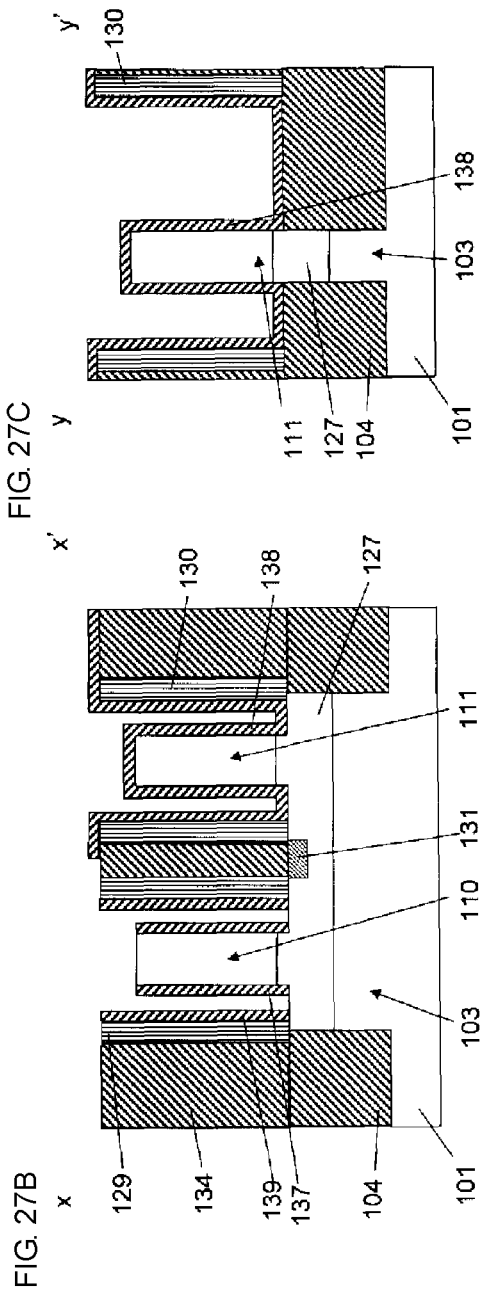
FIG. 27A
FIG. 27B
FIG. 27C

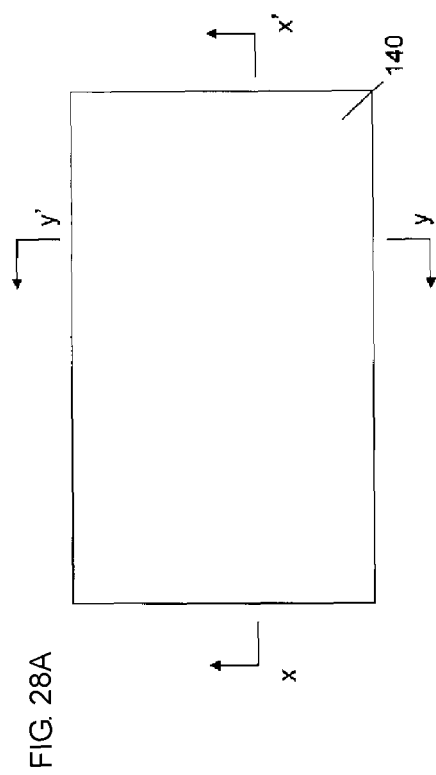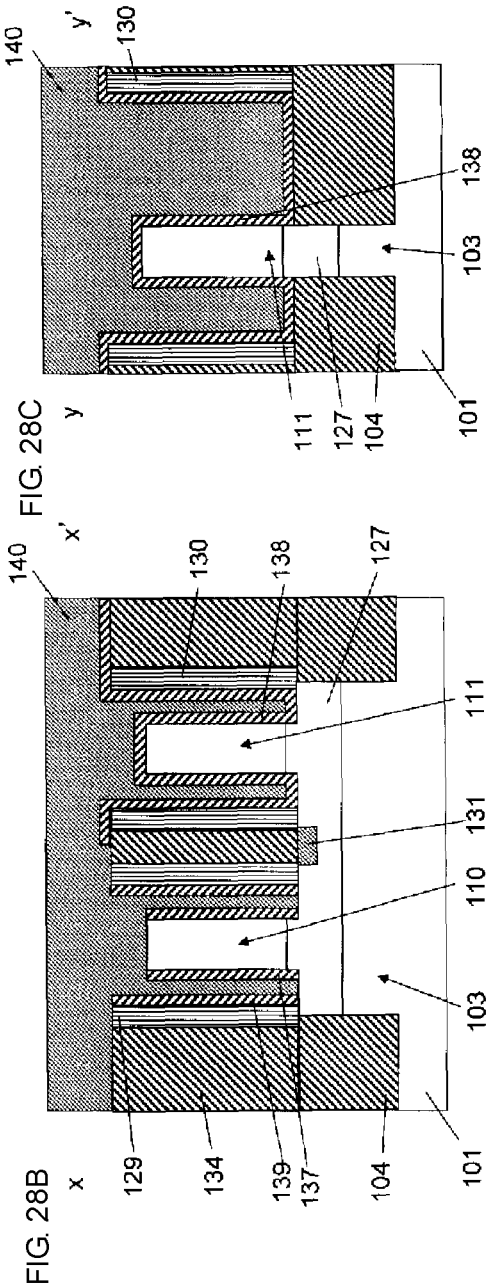
FIG. 28A
FIG. 28B
FIG. 28C

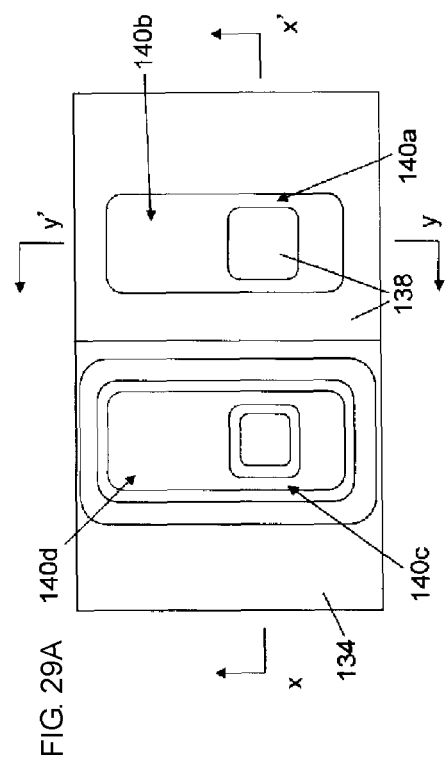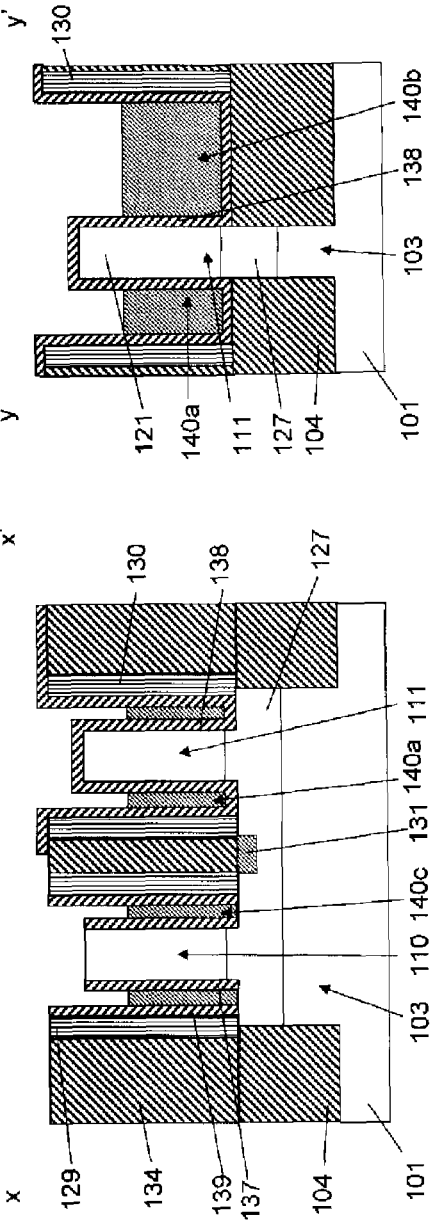

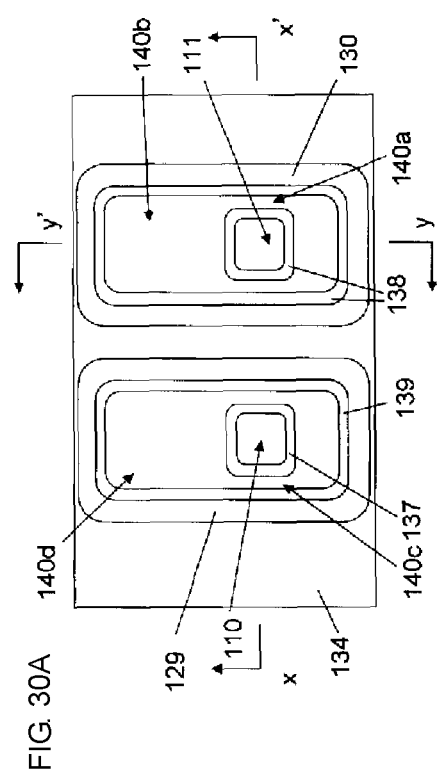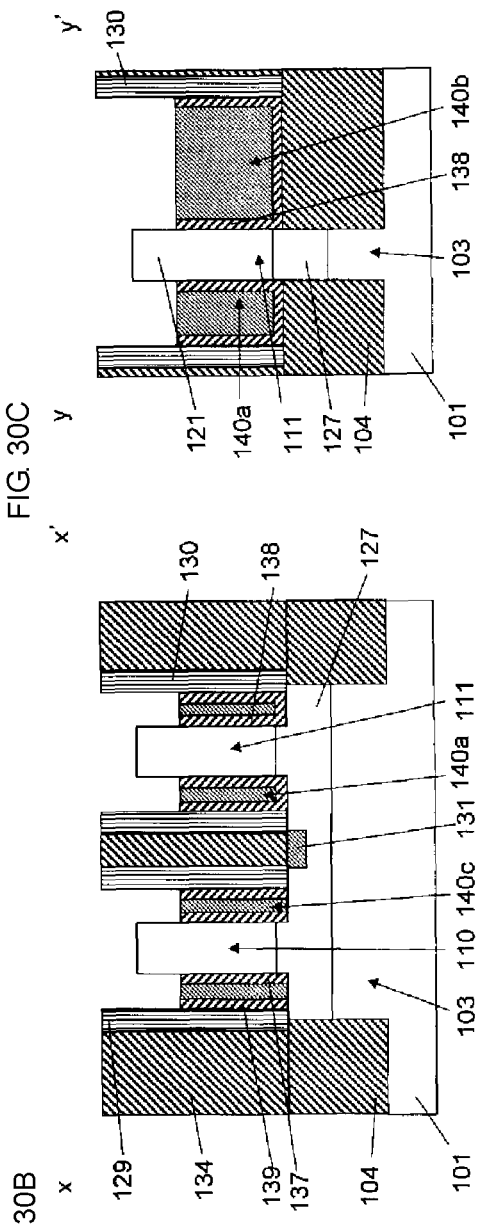

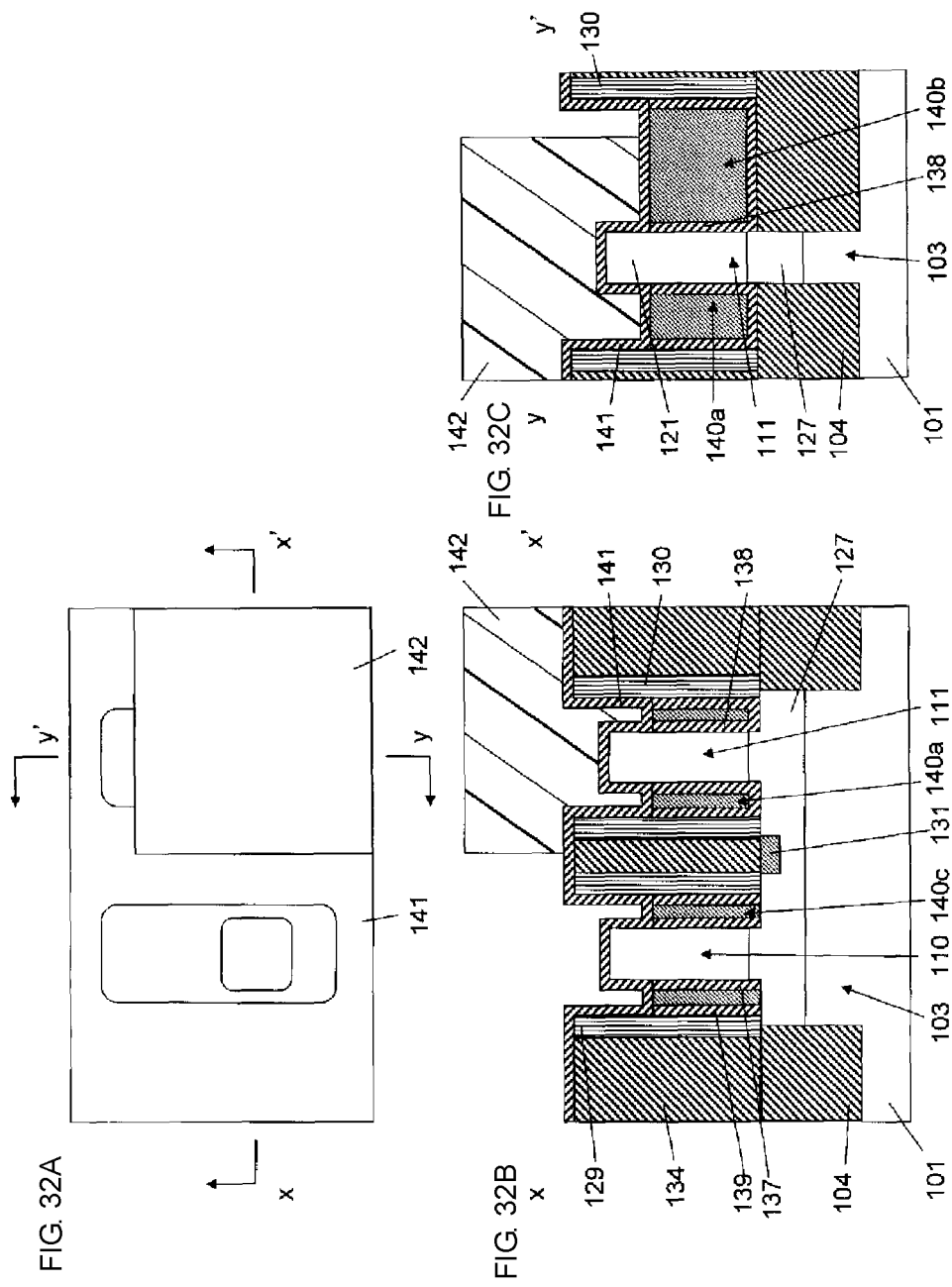

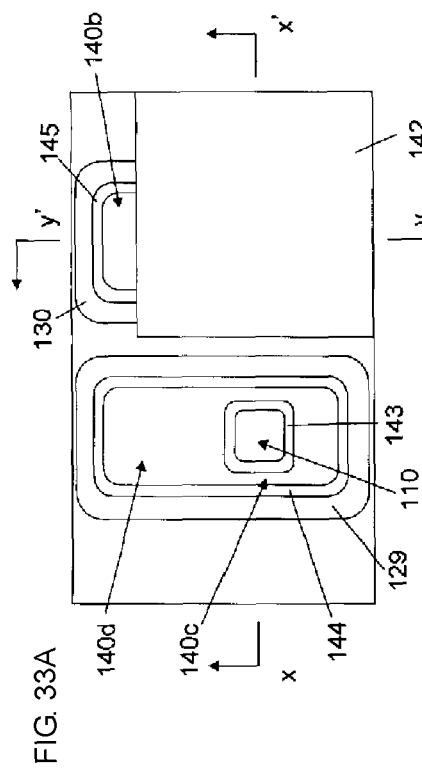
FIG. 33A
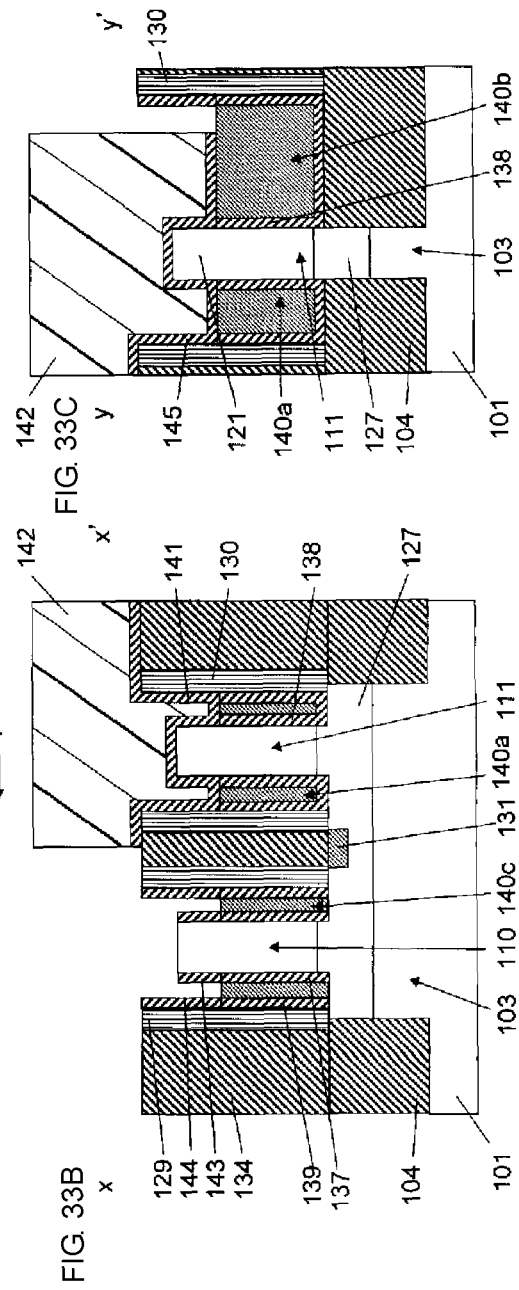
FIG. 33B
FIG. 33C

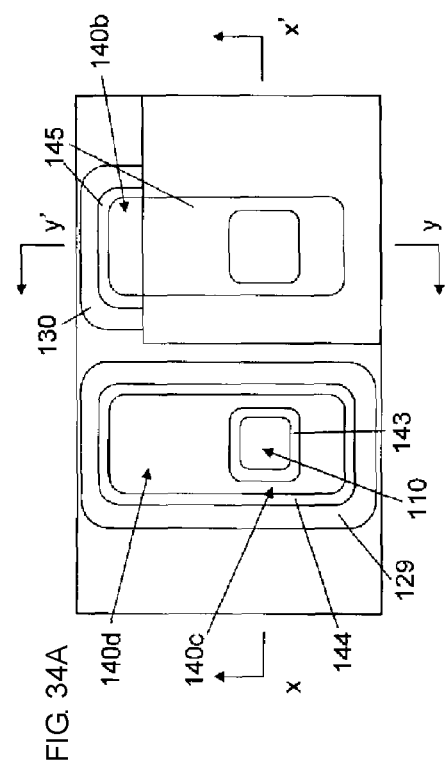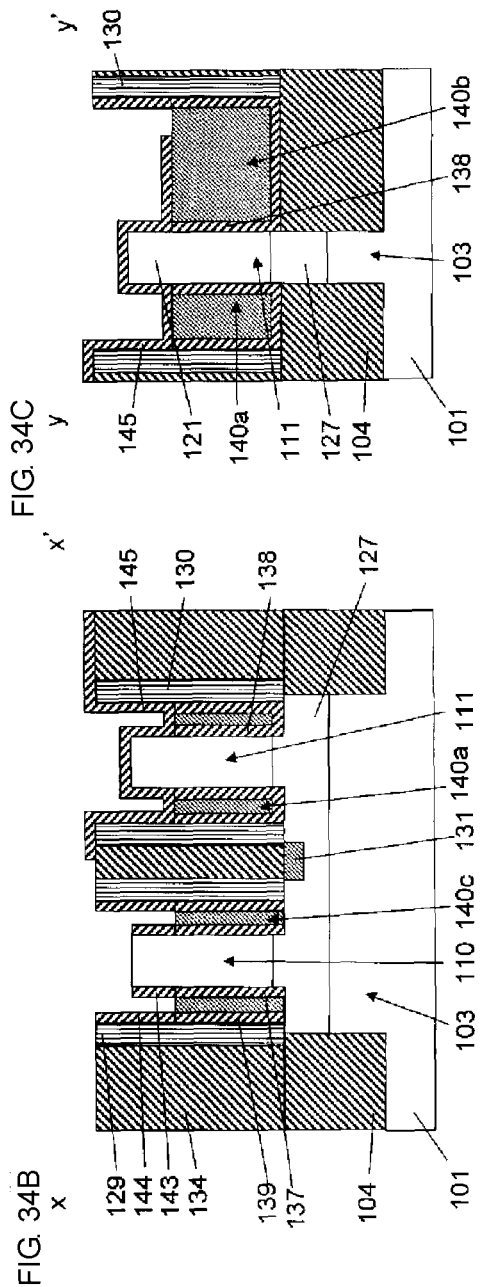

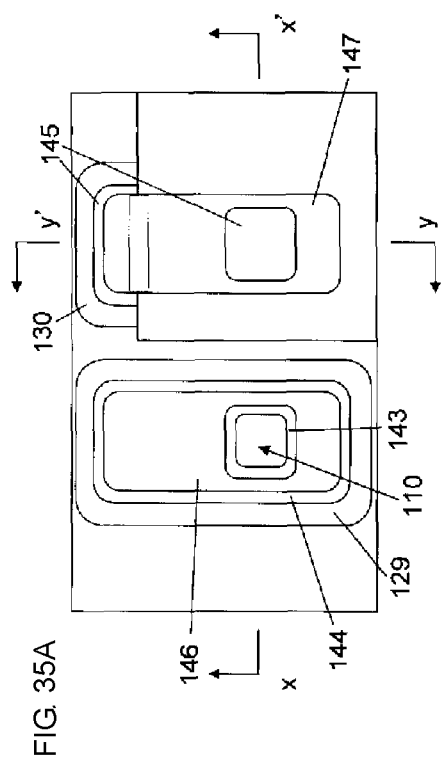
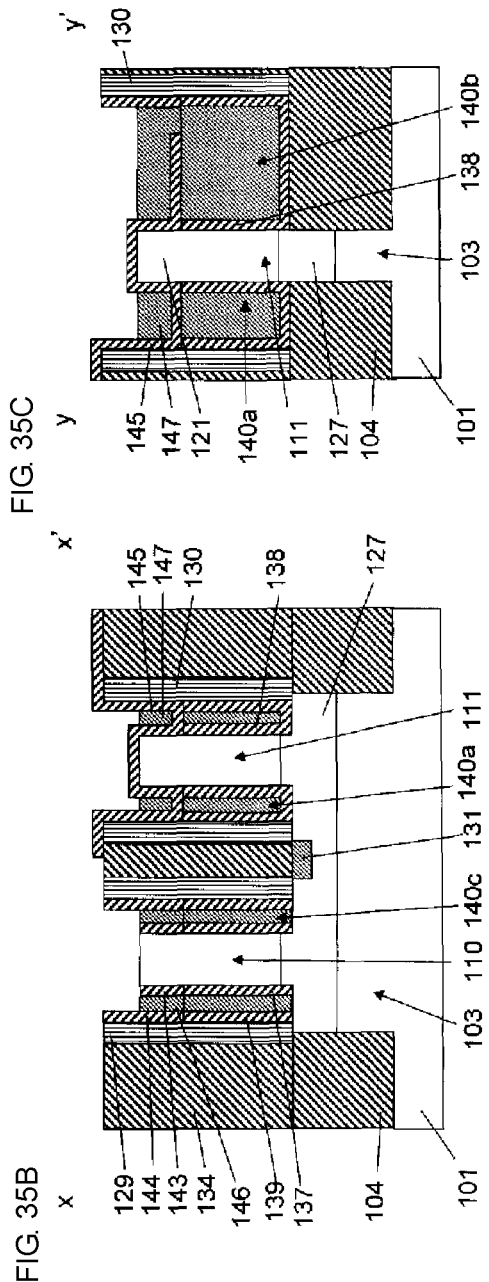
FIG. 35A
FIG. 35B
FIG. 35C

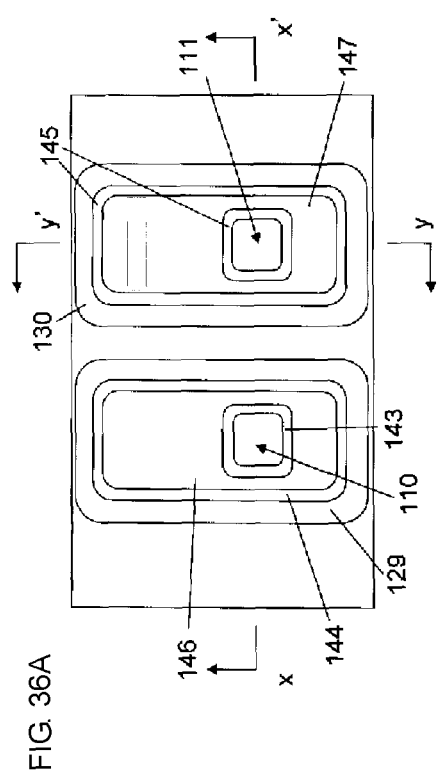
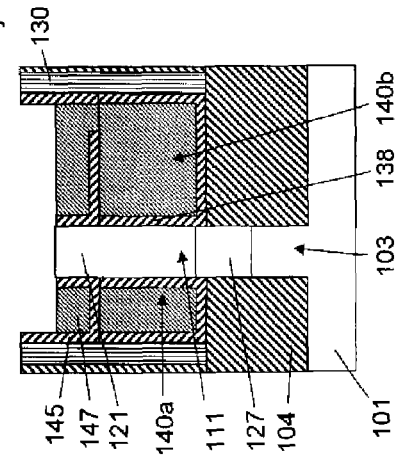
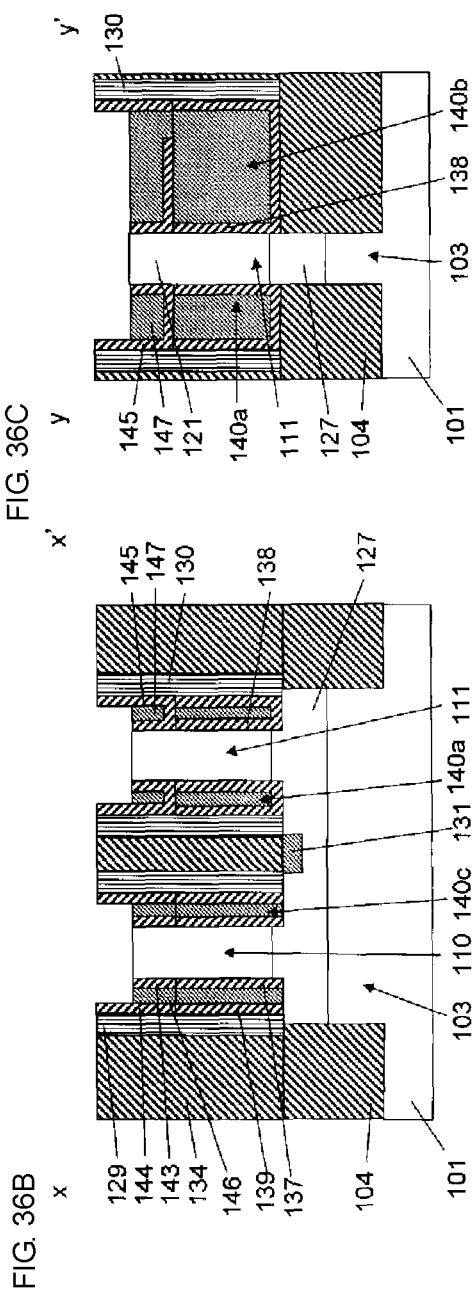

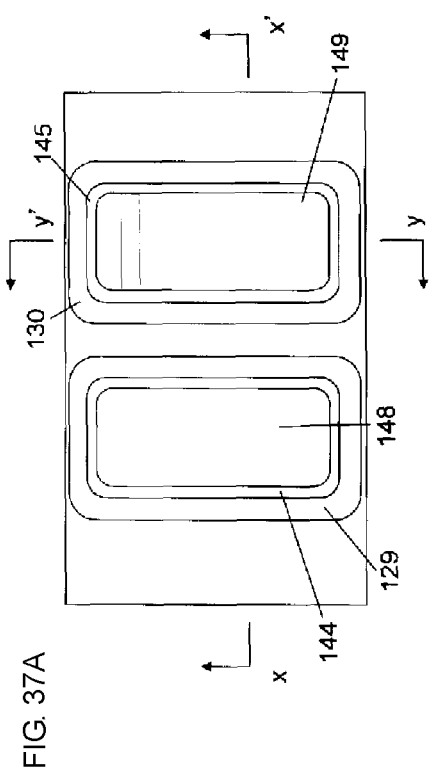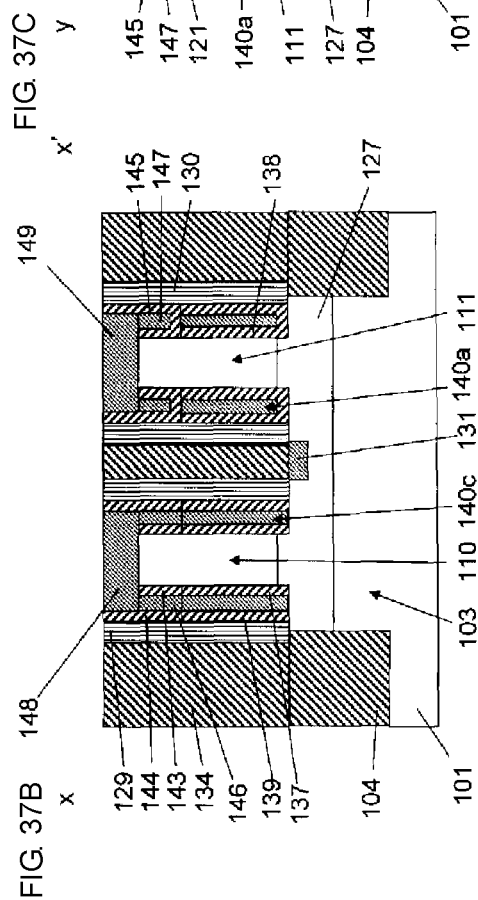

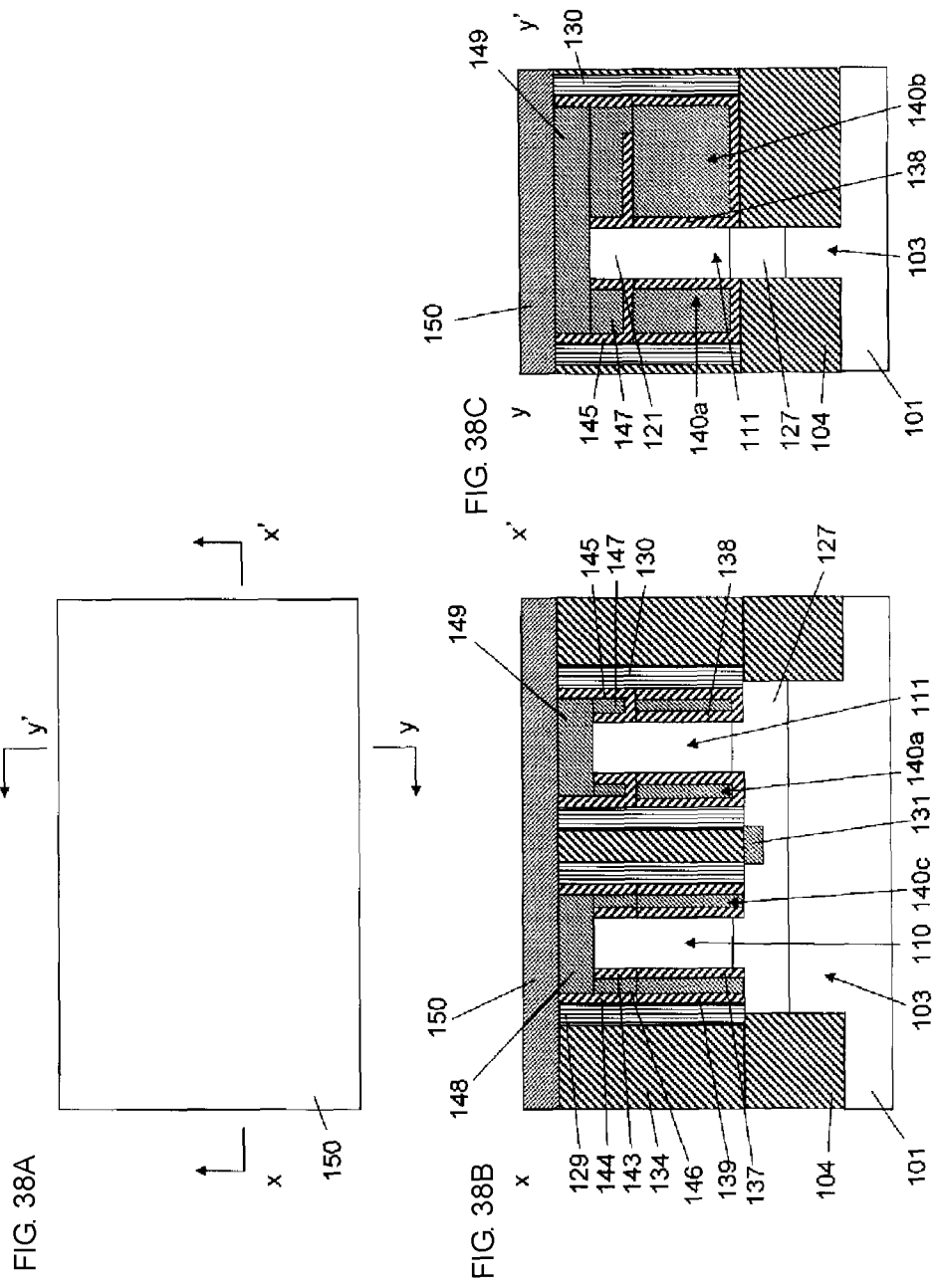

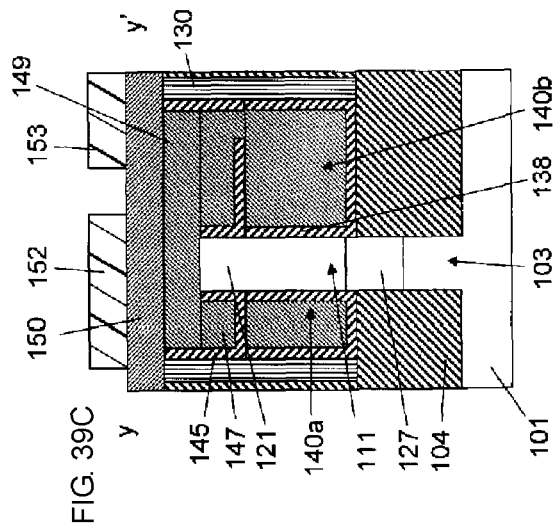
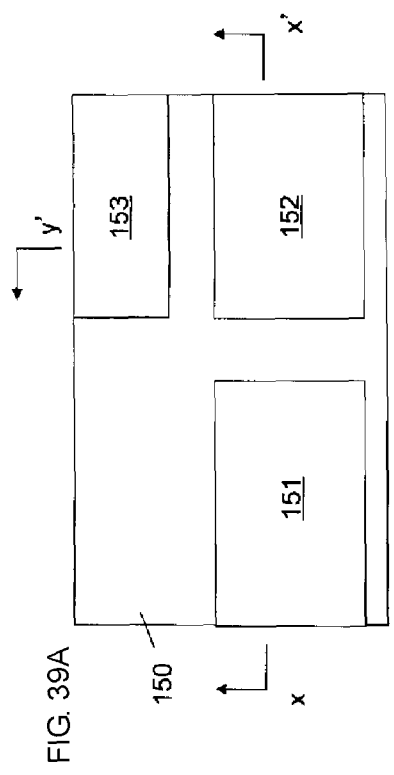
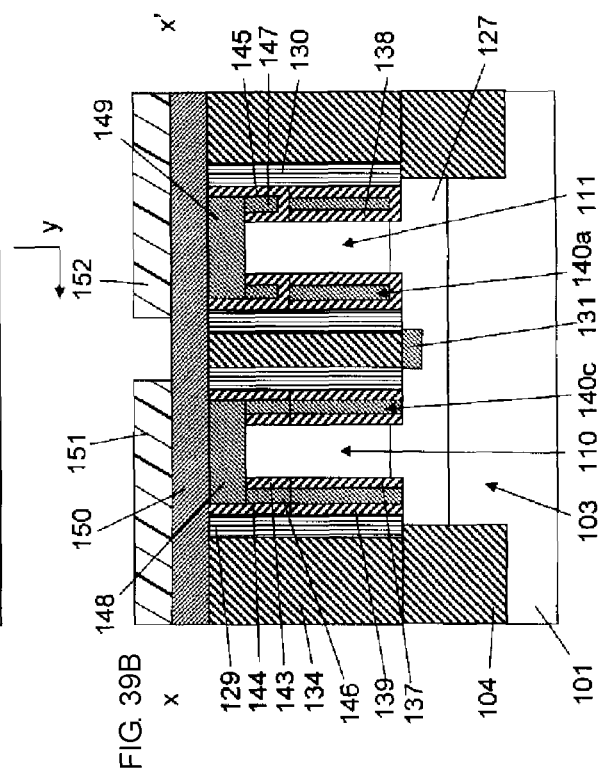

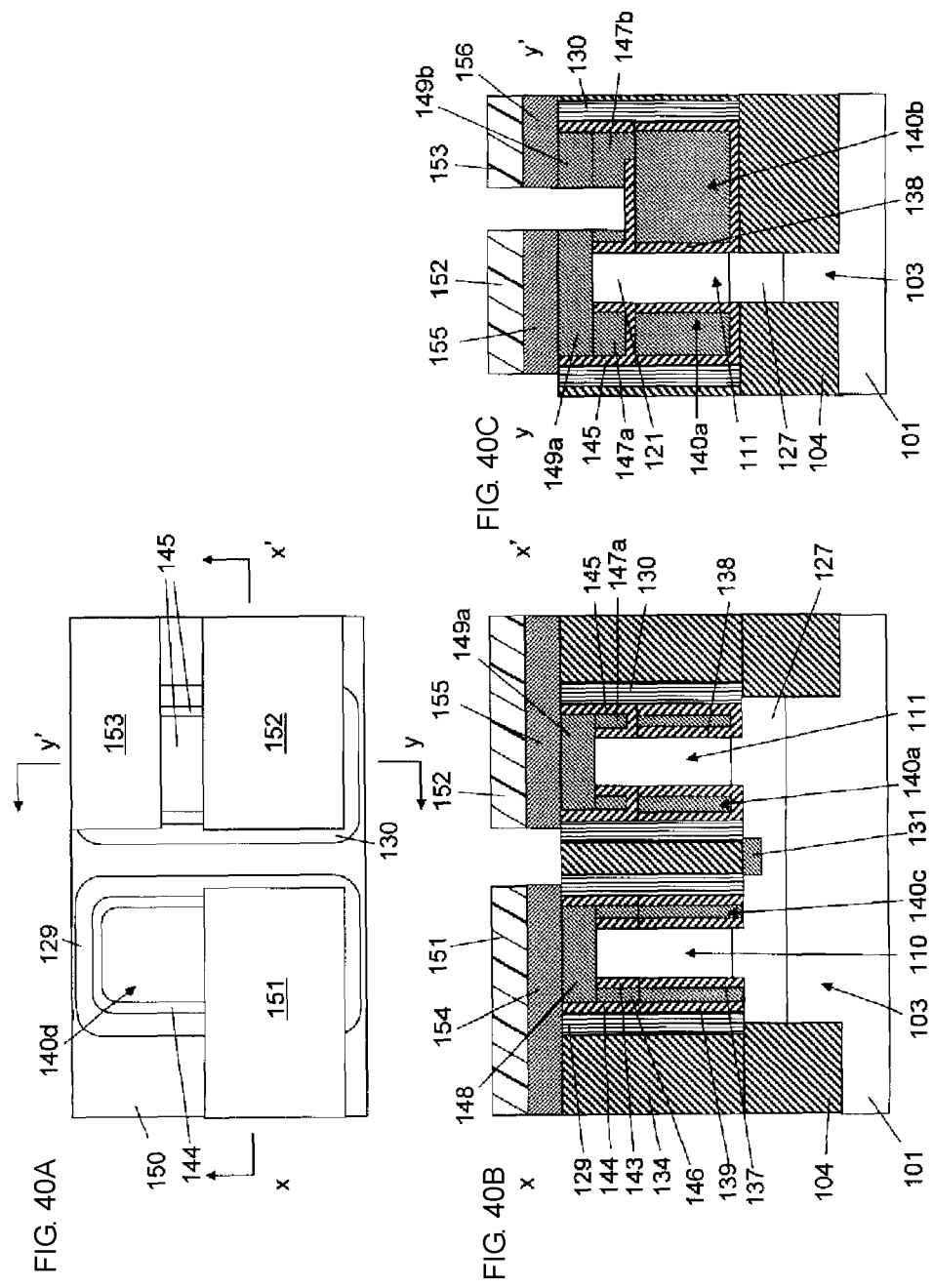

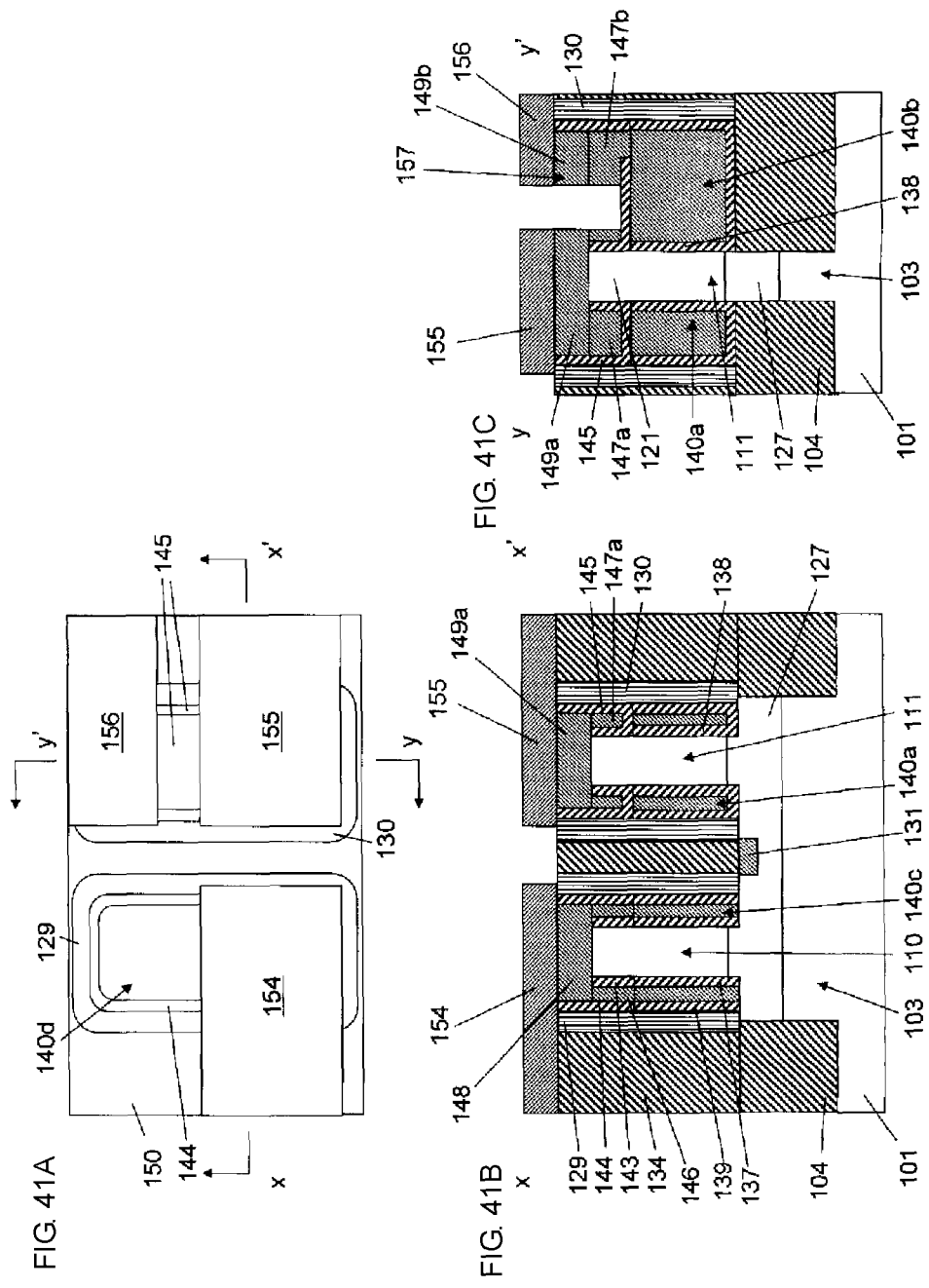

METHOD FOR PRODUCING SEMICONDUCTOR DEVICE

RELATED APPLICATIONS

The present application is divisional patent application of U.S. application Ser. No. 14/847,510, filed Sep. 8, 2015, which is a continuation application of PCT/JP2013/071355, filed Aug. 7, 2013, the entire contents of which are incorporated herein by reference.

BACKGROUND

1. Technical Field

The present invention relates to a method for producing a semiconductor device and a semiconductor device.

2. Description of the Related Art

The degree of integration of semiconductor integrated circuits, in particular, integrated circuits using MOS transistors, has been continuously increasing. With this trend toward a higher degree of integration, the size of MOS transistors in integrated circuits has been reduced to the order of nanometers. Such reduction in the size of MOS transistors makes it difficult to suppress leakage current. Since a certain amount of current needs to be provided, it is difficult to achieve reduction in the area occupied by circuits, which has been problematic. In order to address such a problem, a Surrounding Gate Transistor (hereafter referred to as "SGT"), which has a structure in which a source, a gate, and a drain are arranged in a direction perpendicular to a substrate and a gate electrode surrounds a pillar-shaped semiconductor layer, has been proposed (for example, refer to Japanese Unexamined Patent Application Publication No. 2-71556, Japanese Unexamined Patent Application Publication No. 2-188966, and Japanese Unexamined Patent Application Publication No. 3-145761).

In an existing SGT production method, a mask for forming silicon pillars is used to form silicon pillars including pillar-shaped nitride hard masks, a mask for forming a planar silicon layer is used to form a planar silicon layer under the silicon pillars, and a mask for forming gate lines is used to form gate lines (for example, refer to Japanese Unexamined Patent Application Publication No. 2009-182317).

In other words, three masks are used to form silicon pillars, a planar silicon layer, and gate lines.

Also, in an existing SGT production method, in order to establish a connection between an upper portion of a planar silicon layer and metal wiring, a deep contact hole is formed (for example, refer to Japanese Unexamined Patent Application Publication No. 2009-182317). With reduction in the size of devices, the aspect ratio (depth/diameter) of contact holes increases. This increase in the aspect ratio causes a decrease in the etching rate. Also, with reduction in the size of a pattern, the thickness of the resist film decreases. Such a thin resist film is itself etched during etching, which makes it difficult to form deep contact holes.

In existing MOS transistors, in order to successfully perform a metal gate process and a high-temperature process, a metal gate-last process of forming a metal gate after a high-temperature process is used for actual products (IEDM2007 K. Mistry et. al, pp 247-250). In production of an SGT, a gate is formed of polysilicon; an interlayer insulating film is subsequently deposited; chemical mechanical polishing is performed to expose the polysilicon gate; the polysilicon gate is etched; and metal is subsequently deposited. Thus, also in the production of an SGT, in order to successfully perform a metal gate process and a high-temperature process, a metal gate-last process of forming a metal gate after a high-temperature process needs to be used.

In the metal gate-last process, after a polysilicon gate is formed, a diffusion layer is formed by ion implantation. However, in an SGT, the upper portion of the pillar-shaped silicon layer is covered with a polysilicon gate. Accordingly, it is necessary to find a way to form a diffusion layer.

With a decrease in the thickness of silicon pillars, since silicon has a density of $5 \times 10^{22}$ atoms/cm$^3$, it becomes difficult to make impurities be present in silicon pillars.

In existing SGTs, it has been proposed that, while the channel concentration is set to a low impurity concentration of $10^{17}$ cm$^{-3}$ or less, the work function of the gate material is changed to control the threshold voltage (for example, refer to Japanese Unexamined Patent Application Publication No. 2004-356314).

A planar MOS transistor has been disclosed in which a sidewall for an LDD region is formed of a polycrystalline silicon of the same conductivity type as that of the lightly doped layer and the surface carriers of the LDD region are induced by the work-function difference between the sidewall and the LDD region, so that the impedance of the LDD region can be reduced, compared with oxide film sidewall LDD MOS transistors (for example, refer to Japanese Unexamined Patent Application Publication No. 11-297984). This publication states that the polycrystalline silicon sidewall is electrically insulated from the gate electrode. This publication also shows that, in a drawing, the polycrystalline silicon sidewall and the source-drain are insulated from each other with an interlayer insulating film.

In existing MOS transistors, in order to decrease a parasitic capacitance between a gate line and a substrate, a first insulating film is used. For example, in a FINFET (IEDM2010 CC. Wu, et. al, 27.1.1-27.1.4), a first insulating film is formed around a single fin-shaped semiconductor layer and the first insulating film is subjected to etch back to expose the fin-shaped semiconductor layer, so that the parasitic capacitance between the gate line and the substrate is decreased. Also for SGTs, in order to decrease the parasitic capacitance between a gate line and a substrate, a first insulating film needs to be used. Since an SGT includes, in addition to a fin-shaped semiconductor layer, a pillar-shaped semiconductor layer, it is necessary to find a way to form the pillar-shaped semiconductor layer.

SUMMARY

Provided are a method for producing an SGT by a gate-last process in which a gate electrode and a gate line are formed around a first pillar-shaped semiconductor layer and simultaneously a contact line and a contact electrode connected to an upper portion of a fin-shaped semiconductor layer are formed around a second pillar-shaped semiconductor layer, the SGT having a structure in which upper portions of pillar-shaped semiconductor layers formed by self alignment function as an n-type semiconductor layer or a p-type semiconductor layer due to a work-function difference between metal and semiconductor; and a contact structure and an SGT structure produced by this method.

A method for producing a semiconductor device according to an embodiment of the present invention includes a first step of forming a fin-shaped semiconductor layer on a semiconductor substrate and forming a first insulating film around the fin-shaped semiconductor layer; a second step of, after the first step, forming a first pillar-shaped semiconductor layer, a first dummy gate formed from a first polysilicon, a second pillar-shaped semiconductor layer, and a second dummy gate formed from the first polysilicon; a third step of, after the second step, forming a third dummy gate and a fourth dummy gate on side walls of the first dummy gate, the first pillar-shaped semiconductor layer, the second dummy gate, and the second pillar-shaped semiconductor layer; a fourth step of, after the third step, forming a third diffusion layer in an upper portion of the fin-shaped semiconductor layer, in a lower portion of the first pillar-shaped semiconductor layer, and in a lower portion of the second pillar-shaped semiconductor layer; a fifth step of, after the fourth step, depositing an interlayer insulating film; exposing upper portions of the first dummy gate, the second dummy gate, the third dummy gate, and the fourth dummy gate; removing the first dummy gate, the second dummy gate, the third dummy gate, and the fourth dummy gate; forming a first gate insulating film around the first pillar-shaped semiconductor layer and around the second pillar-shaped semiconductor layer; removing the first gate insulating film from around a bottom portion of the second pillar-shaped semiconductor layer; depositing a first metal; exposing an upper portion of the first pillar-shaped semiconductor layer and an upper portion of the second pillar-shaped semiconductor layer; forming a gate electrode and a gate line around the first pillar-shaped semiconductor layer; and forming a contact electrode and a contact line around the second pillar-shaped semiconductor layer; and a sixth step of, after the fifth step, depositing a second gate insulating film around the first pillar-shaped semiconductor layer, on the gate electrode, on the gate line, around the second pillar-shaped semiconductor layer, on the contact electrode, and on the contact line; removing a portion of the second gate insulating film on the gate line and at least portions of the second gate insulating film on the contact electrode and on the contact line; depositing a second metal; exposing an upper portion of the first pillar-shaped semiconductor layer and an upper portion of the second pillar-shaped semiconductor layer; removing the second gate insulating film on the first pillar-shaped semiconductor layer; depositing a third metal; etching a portion of the third metal and a portion of the second metal to form a first contact in which the second metal surrounds an upper side wall of the first pillar-shaped semiconductor layer, to form a second contact that connects an upper portion of the first contact to an upper portion of the first pillar-shaped semiconductor layer, to form a third contact formed of the second metal and the third metal formed on the gate line, to form a fourth contact in which the second metal surrounds an upper side wall of the second pillar-shaped semiconductor layer and is connected to the contact electrode, and to form a fifth contact that connects an upper portion of the fourth contact to an upper portion of the second pillar-shaped semiconductor layer.

According to an embodiment, in the second step, a second insulating film is formed around the fin-shaped semiconductor layer, the first polysilicon is deposited on the second insulating film to achieve planarization, a second resist for forming a first gate line and the first pillar-shaped semiconductor layer and a third resist for forming a first contact line and the second pillar-shaped semiconductor layer are formed in a direction perpendicular to a direction of the fin-shaped semiconductor layer, and the first polysilicon, the second insulating film, and the fin-shaped semiconductor layer are etched to form the first pillar-shaped semiconductor layer, the first dummy gate formed from the first polysilicon, the second pillar-shaped semiconductor layer, and the second dummy gate formed from the first polysilicon.

According to an embodiment, after the first polysilicon is deposited on the second insulating film to achieve planarization, a third insulating film is further formed on the first polysilicon.

According to an embodiment, after the second step, in the third step, a fourth insulating film is formed around the first pillar-shaped semiconductor layer, the second pillar-shaped semiconductor layer, the first dummy gate, and the second dummy gate; a second polysilicon is deposited around the fourth insulating film; and the second polysilicon is etched so as to remain on side walls of the first dummy gate, the first pillar-shaped semiconductor layer, the second dummy gate, and the second pillar-shaped semiconductor layer to form the third dummy gate and the fourth dummy gate.

According to an embodiment, in the fourth step, the third diffusion layer is formed in the upper portion of the fin-shaped semiconductor layer, in the lower portion of the first pillar-shaped semiconductor layer, and in the lower portion of the second pillar-shaped semiconductor layer; a fifth insulating film is formed around the third dummy gate and the fourth dummy gate; the fifth insulating film is etched so as to have a sidewall shape to form sidewalls formed of the fifth insulating film; and a metal-semiconductor compound is formed on the third diffusion layer.

According to an embodiment, after the fourth step, in the fifth step, the interlayer insulating film is deposited and subjected to chemical mechanical polishing to expose upper portions of the first dummy gate, the second dummy gate, the third dummy gate, and the fourth dummy gate; the first dummy gate, the second dummy gate, the third dummy gate, and the fourth dummy gate are removed; the second insulating film and the fourth insulating film are removed; the first gate insulating film is formed around the first pillar-shaped semiconductor layer, around the second pillar-shaped semiconductor layer, and on inner sides of the fifth insulating film; a fourth resist for removing the gate insulating film from around a bottom portion of the second pillar-shaped semiconductor layer is formed; the first gate insulating film is removed from around the bottom portion of the second pillar-shaped semiconductor layer; the first metal is deposited; and the first metal is subjected to etch back to expose the upper portion of the first pillar-shaped semiconductor layer and the upper portion of the second pillar-shaped semiconductor layer, to form the gate electrode and the gate line around the first pillar-shaped semiconductor layer, and to form the contact electrode and the contact line around the second pillar-shaped semiconductor layer.

A semiconductor device according to an embodiment of the present invention includes a fin-shaped semiconductor layer formed on a semiconductor substrate; a first insulating film formed around the fin-shaped semiconductor layer; a second pillar-shaped semiconductor layer formed on the fin-shaped semiconductor layer; a contact electrode formed of metal and formed around the second pillar-shaped semiconductor layer; a contact line formed of metal and extending in a direction orthogonal to the fin-shaped semiconductor layer connected to the contact electrode; a third diffusion layer formed in an upper portion of the fin-shaped semiconductor layer and in a lower portion of the second pillar-shaped semiconductor layer; the contact electrode being connected to the third diffusion layer; a fourth contact surrounding an upper side wall of the second pillar-shaped semiconductor layer and being connected to the contact electrode; and a fifth contact connecting an upper portion of the fourth contact to an upper portion of the second pillar-shaped semiconductor layer.

According to an embodiment, the semiconductor device includes a first gate insulating film formed between the second pillar-shaped semiconductor layer and the contact electrode.

According to an embodiment, the semiconductor device includes a second gate insulating film formed between the upper side wall of the second pillar-shaped semiconductor layer and the fourth contact.

According to an embodiment, in the semiconductor device, a width of the second pillar-shaped semiconductor layer in a direction orthogonal to the fin-shaped semiconductor layer is the same as a width of the fin-shaped semiconductor layer in the direction orthogonal to the fin-shaped semiconductor layer.

According to an embodiment, the semiconductor device further includes the first gate insulating film formed around the contact electrode and the contact line.

According to an embodiment, in the semiconductor device, a width of the contact electrode in a direction orthogonal to the contact line is the same as a width of the contact line in the direction orthogonal to the contact line.

According to an embodiment, in the semiconductor device, a width of the fourth contact in a direction orthogonal to the contact line is the same as a width of the contact electrode in the direction orthogonal to the contact line.

According to an embodiment, in the semiconductor device, a width of the fifth contact in a direction orthogonal to the contact line is the same as a width of the fourth contact in the direction orthogonal to the contact line.

According to an embodiment, the semiconductor device further includes a fin-shaped semiconductor layer formed on the semiconductor substrate; a first insulating film formed around the fin-shaped semiconductor layer; a first pillar-shaped semiconductor layer formed on the fin-shaped semiconductor layer; the first gate insulating film further formed around the first pillar-shaped semiconductor layer; a gate electrode formed of metal and formed around the first gate insulating film; a gate line formed of metal and extending in a direction orthogonal to the fin-shaped semiconductor layer connected to the gate electrode; the first gate insulating film formed around and below the gate electrode and the gate line; the gate electrode having a width in a direction orthogonal to the gate line, the width being the same as a width of the gate line in the direction orthogonal to the gate line; the third diffusion layer formed in an upper portion of the fin-shaped semiconductor layer and in a lower portion of the first pillar-shaped semiconductor layer; the second gate insulating film formed around an upper side wall of the first pillar-shaped semiconductor layer; a first contact formed of a second metal and formed around the second gate insulating film; a second contact formed of a third metal and connecting an upper portion of the first contact to an upper portion of the first pillar-shaped semiconductor layer; and a third contact formed of the second metal and the third metal formed on the gate line.

According to an embodiment, in the semiconductor device, the second metal of the first contact has a work function of 4.0 eV to 4.2 eV.

According to an embodiment, in the semiconductor device, the second metal of the first contact has a work function of 5.0 eV to 5.2 eV.

Embodiments according to the present invention can provide a method for producing an SGT by a gate-last process in which a gate electrode and a gate line are formed around a first pillar-shaped semiconductor layer and simultaneously a contact line and a contact electrode connected to an upper portion of a fin-shaped semiconductor layer are formed around a second pillar-shaped semiconductor layer, the SGT having a structure in which upper portions of pillar-shaped semiconductor layers formed by self alignment function as an n-type semiconductor layer or a p-type semiconductor layer due to a work-function difference between metal and semiconductor; and a contact structure and an SGT structure produced by this method.

The method may include forming a gate insulating film around the first pillar-shaped semiconductor layer, around the second pillar-shaped semiconductor layer, and on inner sides of the fifth insulating film; subsequently forming a fourth resist for removing the first gate insulating film from around a bottom portion of the second pillar-shaped semiconductor layer; and removing the first gate insulating film from around the bottom portion of the second pillar-shaped semiconductor layer. As a result, a gate electrode and a gate line can be formed around the first pillar-shaped semiconductor layer and simultaneously a contact line and a contact electrode connected to an upper portion of a fin-shaped semiconductor layer can be formed around the second pillar-shaped semiconductor layer. Thus, the connection can be established by etching just for the thickness of the first gate insulating film, which eliminates the necessity of performing the step of forming deep contact holes.

After the fifth step, holes having the same shapes as the gate electrode and the gate line are left above the gate electrode and the gate line. Also, holes having the same shapes as the contact electrode and the contact line are left above the contact electrode and the contact line. In this case, the exposed first gate insulating film is removed; a second gate insulating film is deposited around the first pillar-shaped semiconductor layer, on the gate electrode, on the gate line, around the second pillar-shaped semiconductor layer, on the contact electrode, and on the contact line; a portion of the second gate insulating film on the gate line and at least portions of the second gate insulating film on the contact electrode and on the contact line are removed; a second metal is deposited and subjected to etch back. As a result, the holes having the same shapes as the gate electrode and the gate line and the holes having the same shapes as the contact electrode and the contact line are filled with the metal, to thereby form, by self alignment, a first contact in which the second metal surrounds an upper side wall of the pillar-shaped semiconductor layer and a fourth contact in which the second metal surrounds an upper side wall of the second pillar-shaped semiconductor layer and is connected to the contact electrode.

Since the portion of the second gate insulating film on the gate line is removed, a third contact for the gate line can be simultaneously formed, which facilitates formation of the contact for the gate line.

Accordingly, the contact can be formed by etching just for the thickness of the first gate insulating film and the thickness of the second gate insulating film, which eliminates the necessity of performing the step of forming a deep contact hole.

This structure including a second pillar-shaped silicon layer 110, a contact electrode 140c and a contact line 140d formed around the second pillar-shaped silicon layer 110, a fourth contact 146 surrounding an upper side wall of the second pillar-shaped silicon layer 110 and being connected to the contact electrode 140c, and a fifth contact 148 connecting an upper portion of the fourth contact 146 to an upper portion of the second pillar-shaped silicon layer 110 is the same as a transistor structure except that the contact electrode is connected to the third diffusion layer and the fourth contact 146 is connected to the contact electrode. Thus, reduction in the number of steps can be achieved.

BRIEF DESCRIPTION OF THE DRAWING

FIG. 1A is a plan view of a semiconductor device according to an embodiment of the present invention; FIG. 1B is a sectional view taken along line X-X' in FIG. 1A; and FIG. 1C is a sectional view taken along line Y-Y' in FIG. 1A.

FIG. 2A is a plan view relating to a method for producing a semiconductor device according to an embodiment of the present invention; FIG. 2B is a sectional view taken along line X-X' in FIG. 2A; and FIG. 2C is a sectional view taken along line Y-Y' in FIG. 2A.

FIG. 3A is a plan view relating to a method for producing a semiconductor device according to an embodiment of the present invention; FIG. 3B is a sectional view taken along line X-X' in FIG. 3A; and FIG. 3C is a sectional view taken along line Y-Y' in FIG. 3A.

FIG. 4A is a plan view relating to a method for producing a semiconductor device according to an embodiment of the present invention; FIG. 4B is a sectional view taken along line X-X' in FIG. 4A; and FIG. 4C is a sectional view taken along line Y-Y' in FIG. 4A.

FIG. 6A is a plan view relating to a method for producing a semiconductor device according to an embodiment of the present invention; FIG. 6B is a sectional view taken along line X-X' in FIG. 6A; and FIG. 6C is a sectional view taken along line Y-Y' in FIG. 6A.

FIG. 7A is a plan view relating to a method for producing a semiconductor device according to an embodiment of the present invention; FIG. 7B is a sectional view taken along line X-X' in FIG. 7A; and FIG. 7C is a sectional view taken along line Y-Y' in FIG. 7A.

FIG. 8A is a plan view relating to a method for producing a semiconductor device according to an embodiment of the present invention; FIG. 8B is a sectional view taken along line X-X' in FIG. 8A; and FIG. 8C is a sectional view taken along line Y-Y' in FIG. 8A.

FIG. 10A is a plan view relating to a method for producing a semiconductor device according to an embodiment of the present invention; FIG. 10B is a sectional view taken along line X-X' in FIG. 10A; and FIG. 10C is a sectional view taken along line Y-Y' in FIG. 10A.

FIG. 11A is a plan view relating to a method for producing a semiconductor device according to an embodiment of the present invention; FIG. 11B is a sectional view taken along line X-X' in FIG. 11A; and FIG. 11C is a sectional view taken along line Y-Y' in FIG. 11A.

FIG. 12A is a plan view relating to a method for producing a semiconductor device according to an embodiment of the present invention; FIG. 12B is a sectional view taken along line X-X' in FIG. 12A; and FIG. 12C is a sectional view taken along line Y-Y' in FIG. 12A.

FIG. 16A is a plan view relating to a method for producing a semiconductor device according to an embodiment of the present invention; FIG. 16B is a sectional view taken along line X-X' in FIG. 16A; and FIG. 16C is a sectional view taken along line Y-Y' in FIG. 16A.

FIG. 17A is a plan view relating to a method for producing a semiconductor device according to an embodiment of the present invention; FIG. 17B is a sectional view taken along line X-X' in FIG. 17A; and FIG. 17C is a sectional view taken along line Y-Y' in FIG. 17A.

FIG. 19A is a plan view relating to a method for producing a semiconductor device according to an embodiment of the present invention; FIG. 19B is a sectional view taken along line X-X' in FIG. 19A; and FIG. 19C is a sectional view taken along line Y-Y' in FIG. 19A.

FIG. 20A is a plan view relating to a method for producing a semiconductor device according to an embodiment of the present invention; FIG. 20B is a sectional view taken along line X-X' in FIG. 20A; and FIG. 20C is a sectional view taken along line Y-Y' in FIG. 20A.

FIG. 21A is a plan view relating to a method for producing a semiconductor device according to an embodiment of the present invention; FIG. 21B is a sectional view taken along line X-X' in FIG. 21A; and FIG. 21C is a sectional view taken along line Y-Y' in FIG. 21A.

FIG. 22A is a plan view relating to a method for producing a semiconductor device according to an embodiment of the present invention; FIG. 22B is a sectional view taken along line X-X' in FIG. 22A; and FIG. 22C is a sectional view taken along line Y-Y' in FIG. 22A.

FIG. 23A is a plan view relating to a method for producing a semiconductor device according to an embodiment of the present invention; FIG. 23B is a sectional view taken along line X-X' in FIG. 23A; and FIG. 23C is a sectional view taken along line Y-Y' in FIG. 23A.

FIG. 24A is a plan view relating to a method for producing a semiconductor device according to an embodiment of the present invention; FIG. 24B is a sectional view taken along line X-X' in FIG. 24A; and FIG. 24C is a sectional view taken along line Y-Y' in FIG. 24A.

FIG. 26A is a plan view relating to a method for producing a semiconductor device according to an embodiment of the present invention; FIG. 26B is a sectional view taken along line X-X' in FIG. 26A; and FIG. 26C is a sectional view taken along line Y-Y' in FIG. 26A.

FIG. 27A is a plan view relating to a method for producing a semiconductor device according to an embodiment of the present invention; FIG. 27B is a sectional view taken along line X-X' in FIG. 27A; and FIG. 27C is a sectional view taken along line Y-Y' in FIG. 27A.

FIG. 28A is a plan view relating to a method for producing a semiconductor device according to an embodiment of the present invention; FIG. 28B is a sectional view taken along line X-X' in FIG. 28A; and FIG. 28C is a sectional view taken along line Y-Y' in FIG. 28A.

FIG. 29A is a plan view relating to a method for producing a semiconductor device according to an embodiment of the present invention; FIG. 29B is a sectional view taken along line X-X' in FIG. 29A; and FIG. 29C is a sectional view taken along line Y-Y' in FIG. 29A.

FIG. 30A is a plan view relating to a method for producing a semiconductor device according to an embodiment of the present invention; FIG. 30B is a sectional view taken along line X-X' in FIG. 30A; and FIG. 30C is a sectional view taken along line Y-Y' in FIG. 30A.

FIG. 32A is a plan view relating to a method for producing a semiconductor device according to an embodiment of the present invention; FIG. 32B is a sectional view taken along line X-X' in FIG. 32A; and FIG. 32C is a sectional view taken along line Y-Y' in FIG. 32A.

FIG. 33A is a plan view relating to a method for producing a semiconductor device according to an embodiment of the present invention; FIG. 33B is a sectional view taken along line X-X' in FIG. 33A; and FIG. 33C is a sectional view taken along line Y-Y' in FIG. 33A.

FIG. 34A is a plan view relating to a method for producing a semiconductor device according to an embodiment of the present invention; FIG. 34B is a sectional view taken along line X-X' in FIG. 34A; and FIG. 34C is a sectional view taken along line Y-Y' in FIG. 34A.

FIG. 35A is a plan view relating to a method for producing a semiconductor device according to an embodiment of the present invention; FIG. 35B is a sectional view taken along line X-X' in FIG. 35A; and FIG. 35C is a sectional view taken along line Y-Y' in FIG. 35A.

FIG. 36A is a plan view relating to a method for producing a semiconductor device according to an embodiment of the present invention; FIG. 36B is a sectional view taken along line X-X' in FIG. 36A; and FIG. 36C is a sectional view taken along line Y-Y' in FIG. 36A.

FIG. 37A is a plan view relating to a method for producing a semiconductor device according to an embodiment of the present invention; FIG. 37B is a sectional view taken along line X-X' in FIG. 37A; and FIG. 37C is a sectional view taken along line Y-Y' in FIG. 37A.

FIG. 38A is a plan view relating to a method for producing a semiconductor device according to an embodiment of the present invention; FIG. 38B is a sectional view taken along line X-X' in FIG. 38A; and FIG. 38C is a sectional view taken along line Y-Y' in FIG. 38A.

FIG. 39A is a plan view relating to a method for producing a semiconductor device according to an embodiment of the present invention; FIG. 39B is a sectional view taken along line X-X' in FIG. 39A; and FIG. 39C is a sectional view taken along line Y-Y' in FIG. 39A.

FIG. 40A is a plan view relating to a method for producing a semiconductor device according to an embodiment of the present invention; FIG. 40B is a sectional view taken along line X-X' in FIG. 40A; and FIG. 40C is a sectional view taken along line Y-Y' in FIG. 40A.

FIG. 41A is a plan view relating to a method for producing a semiconductor device according to an embodiment of the present invention; FIG. 41B is a sectional view taken along line X-X' in FIG. 41A; and FIG. 41C is a sectional view taken along line Y-Y' in FIG. 41A.

DETAILED DESCRIPTION OF THE PREFERRED EMBODIMENTS

Hereinafter, production steps for forming an SGT structure according to an embodiment of the present invention will be described with reference to FIGS. 2A to 41C.

First, the following is a description of a first step of forming a fin-shaped semiconductor layer on a semiconductor substrate and forming a first insulating film around the fin-shaped semiconductor layer. In this embodiment, a silicon substrate is employed; however, another substrate formed of semiconductor may also be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. In this embodiment, the resist is used as a mask for forming the fin-shaped silicon layer; alternatively, a hard mask such as an oxide film or a nitride film may be used.

As illustrated in FIGS. 4A to 4C, the first resist 102 is removed.

Figure 5C:
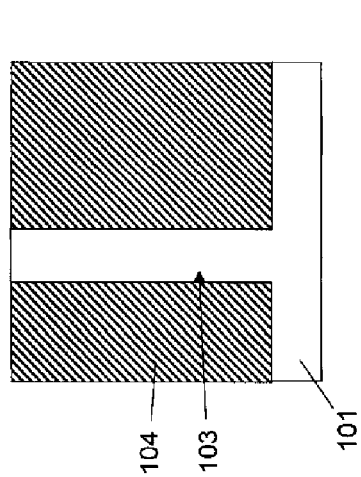
FIG. 5C is a sectional view taken along line Y-Y' in FIG. 5A.
Figure 5A:
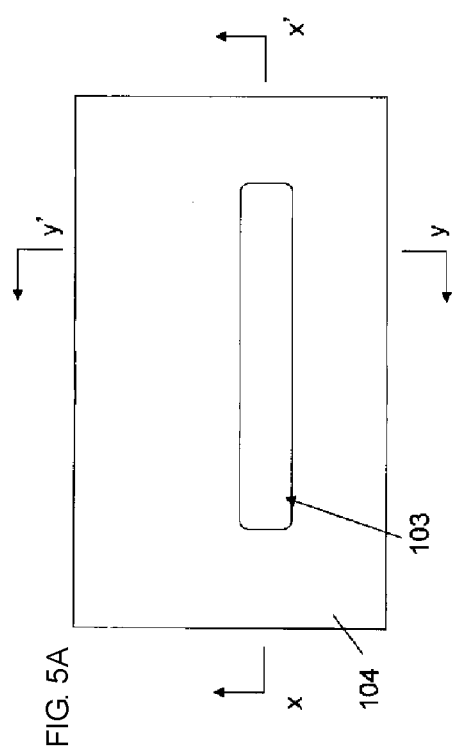
FIG. 5A is a plan view relating to a method for producing a semiconductor device according to an embodiment of the present invention.
Figure 5B:
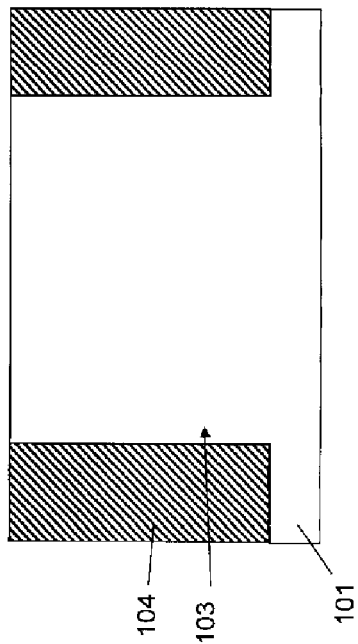
FIG. 5B is a sectional view taken along line X-X' in FIG. 5A.

As illustrated in FIGS. 5A to 5C, a first insulating film 104 is deposited around the fin-shaped silicon layer 103. The first insulating film may be an oxide film formed with high-density plasma or an oxide film formed by low-pressure CVD (Chemical Vapor Deposition).

As illustrated in FIGS. 6A to 6C, the first insulating film 104 is subjected to etch back to expose an upper portion of the fin-shaped silicon layer 103. The step having been described is the same as in a method for producing a fin-shaped silicon layer described in IEDM2010 CC. Wu, et. al, 27.1.1-27.1.4.

Thus, what has been described is the first step of forming a fin-shaped semiconductor layer on a semiconductor substrate and forming a first insulating film around the fin-shaped semiconductor layer.

Next, the following is a description of a second step of forming a second insulating film around the fin-shaped semiconductor layer; depositing a first polysilicon on the second insulating film to achieve planarization; forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer; and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon.

As illustrated in FIGS. 7A to 7C, a second insulating film 105 is formed around the fin-shaped silicon layer 103. The second insulating film 105 is preferably an oxide film.

As illustrated in FIGS. 8A to 8C, a first polysilicon 106 is deposited on the second insulating film 105 to achieve planarization.

Figure 9A:
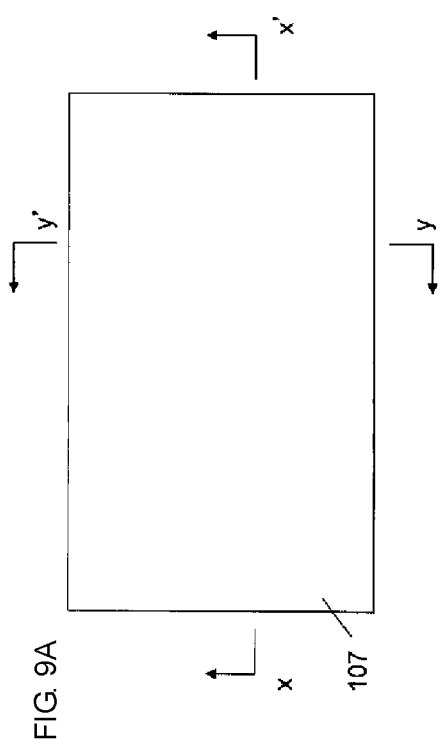
FIG. 9A is a plan view relating to a method for producing a semiconductor device according to an embodiment of the present invention.
Figure 9C:
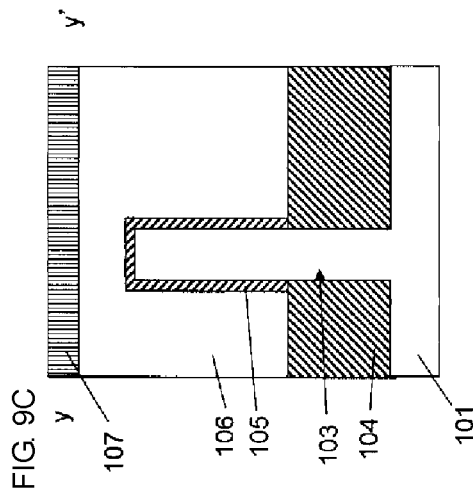
FIG. 9C is a sectional view taken along line Y-Y' in FIG. 9A.
Figure 9B:
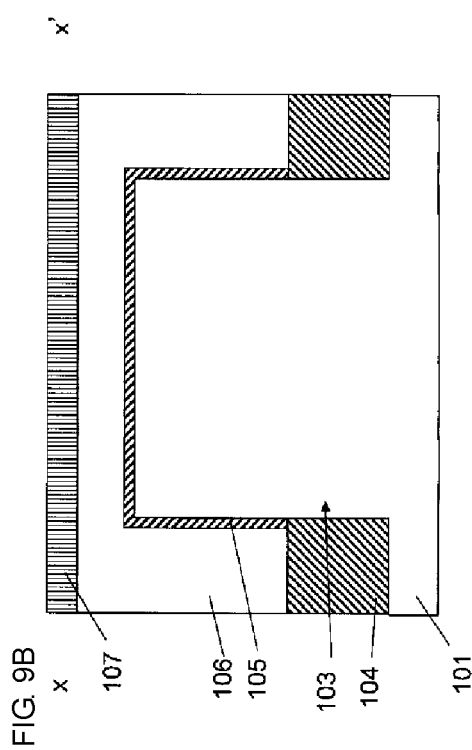
FIG. 9B is a sectional view taken along line X-X' in FIG. 9A.

As illustrated in FIGS. 9A to 9C, a third insulating film 107 is formed on the first polysilicon 106. The third insulating film 107 is preferably a nitride film.

As illustrated in FIGS. 10A to 10C, in a direction perpendicular to a direction of the fin-shaped silicon layer 103, a second resist 108 for forming a gate line and a first pillar-shaped silicon layer and a third resist 109 for forming a first contact line and a second pillar-shaped silicon layer are formed.

As illustrated in FIGS. 11A to 11C, the third insulating film 107, the first polysilicon 106, the second insulating film 105, and the fin-shaped silicon layer 103 are etched to form a first pillar-shaped silicon layer 111, a first dummy gate 115 formed from the first polysilicon, a second pillar-shaped silicon layer 110, and a second dummy gate 114 formed from the first polysilicon. At this time, the third insulating film is divided into third insulating films 113 and 112. Also, the second insulating film is divided into second insulating films 117 and 116. During the etching, in a case where the second resist 108 and the third resist 109 are removed, the third insulating films 113 and 112 function as hard masks. In another case where the second resist is not removed during etching, the third insulating film may be omitted.

As illustrated in FIGS. 12A to 12C, the second resist 108 and the third resist 109 are removed.

Thus, what has been described is the second step of forming a second insulating film around the fin-shaped semiconductor layer; depositing a first polysilicon on the second insulating film to achieve planarization; forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer; and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon.

Next, the following is a description of a third step of, after the second step, forming a fourth insulating film around the first pillar-shaped semiconductor layer, the second pillar-shaped semiconductor layer, the first dummy gate, and the second dummy gate; depositing a second polysilicon around the fourth insulating film; and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

Figure 13A:
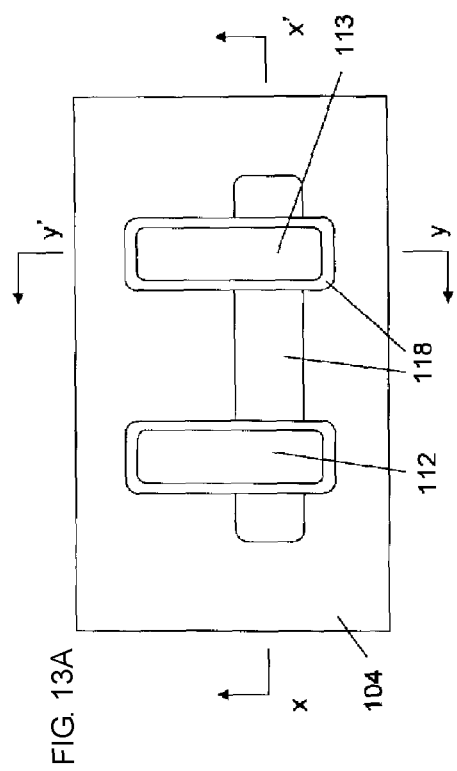
FIG. 13A is a plan view relating to a method for producing a semiconductor device according to an embodiment of the present invention.
Figure 13C:
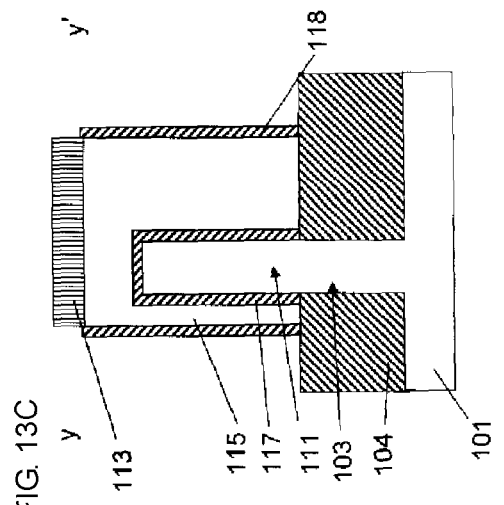
FIG. 13C is a sectional view taken along line Y-Y' in FIG. 13A.
Figure 13B:
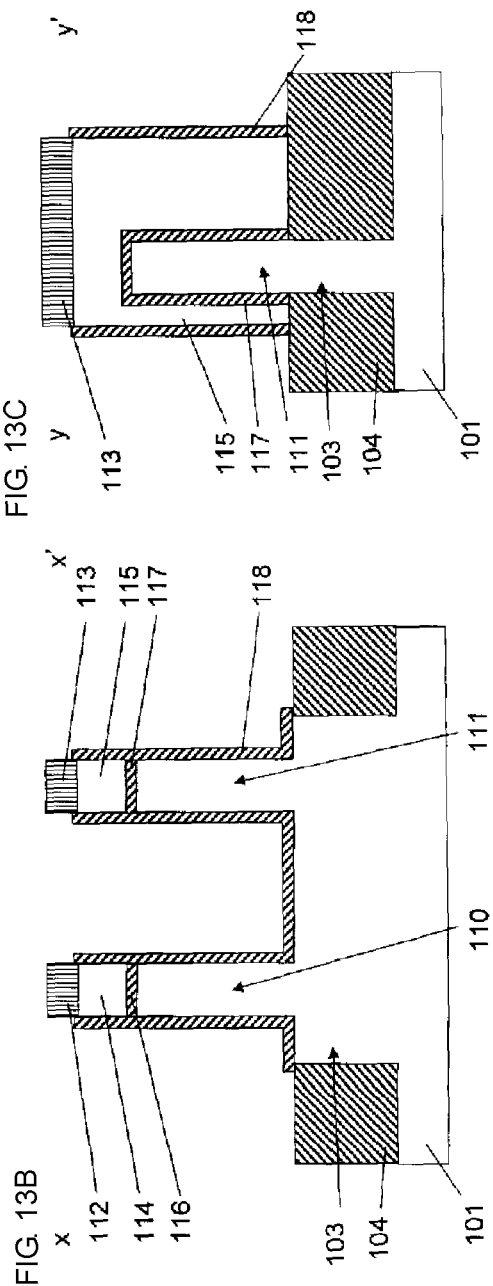
FIG. 13B is a sectional view taken along line X-X' in FIG. 13A.

As illustrated in FIGS. 13A to 13C, a fourth insulating film 118 is formed around the first pillar-shaped silicon layer 111, the second pillar-shaped silicon layer 110, the first dummy gate 115, and the second dummy gate 114. The fourth insulating film 118 is preferably an oxide film.

Figure 14A:
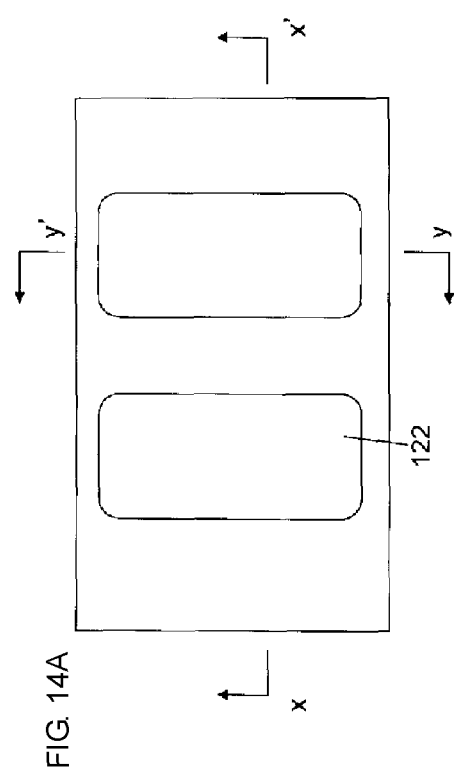
FIG. 14A is a plan view relating to a method for producing a semiconductor device according to an embodiment of the present invention.
Figure 14C:
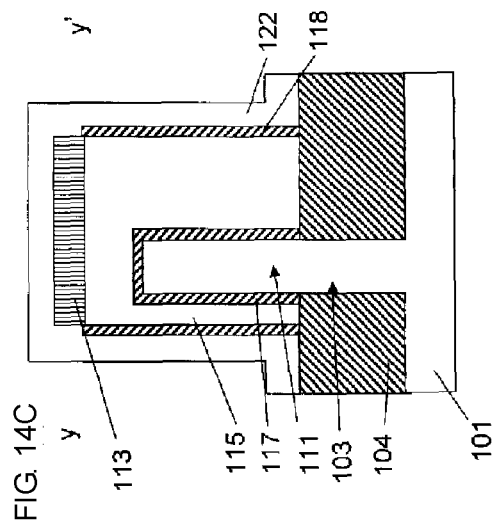
FIG. 14C is a sectional view taken along line Y-Y' in FIG. 14A.
Figure 14B:
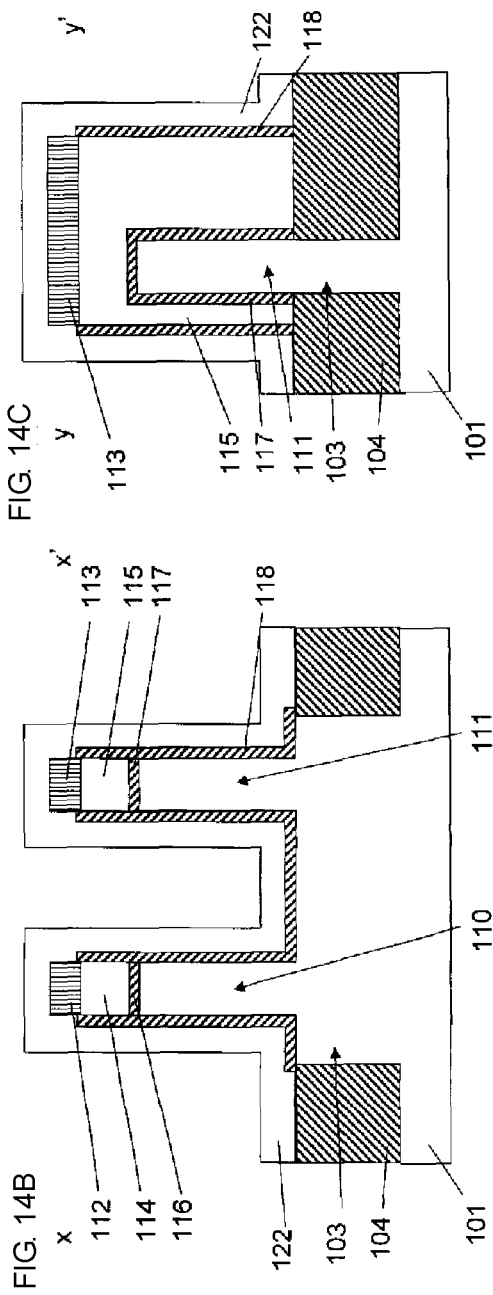
FIG. 14B is a sectional view taken along line X-X' in FIG. 14A.

As illustrated in FIGS. 14A to 14C, a second polysilicon 122 is deposited around the fourth insulating film 118.

Figure 15A:
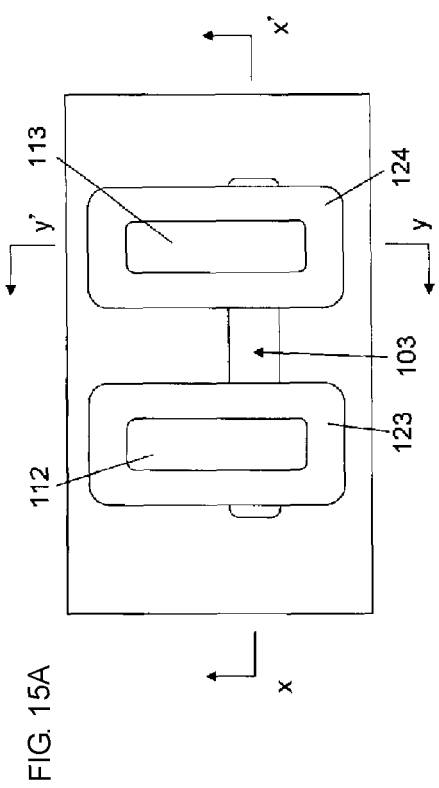
FIG. 15A is a plan view relating to a method for producing a semiconductor device according to an embodiment of the present invention.
Figure 15C:
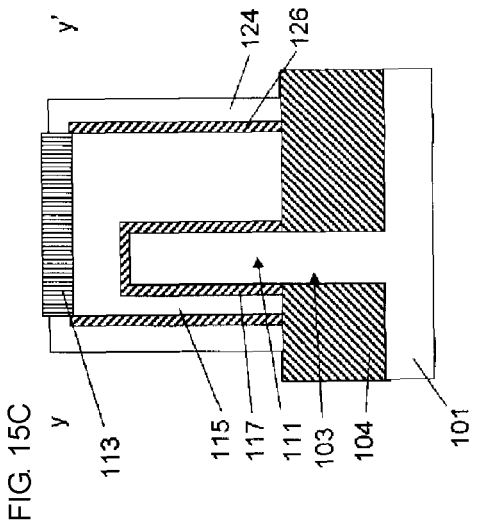
FIG. 15C is a sectional view taken along line Y-Y' in FIG. 15A.
Figure 15B:
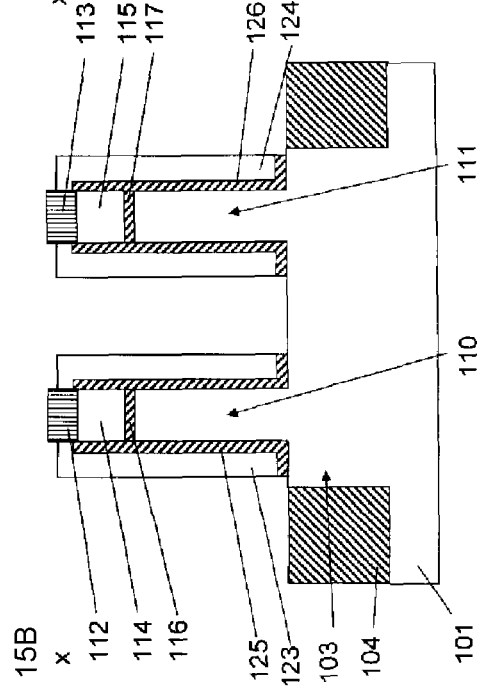
FIG. 15B is a sectional view taken along line X-X' in FIG. 15A.

As illustrated in FIGS. 15A to 15C, the second polysilicon 122 is etched so as to remain on side walls of the first dummy gate 115, the first pillar-shaped silicon layer 111, the second dummy gate 114, and the second pillar-shaped silicon layer 110 to form a third dummy gate 124 and a fourth dummy gate 123. In this case, the fourth insulating film may be divided into fourth insulating films 126 and 125.

Thus, what has been described is the third step of, after the second step, forming a fourth insulating film around the first pillar-shaped semiconductor layer, the second pillar-shaped semiconductor layer, the first dummy gate, and the second dummy gate; depositing a second polysilicon around the fourth insulating film; and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

Next, the following is a description of a fourth step of forming the third diffusion layer in the upper portion of the fin-shaped semiconductor layer, in the lower portion of the first pillar-shaped semiconductor layer, and in the lower portion of the second pillar-shaped semiconductor layer; forming a fifth insulating film around the third dummy gate and the fourth dummy gate; etching the fifth insulating film so as to have a sidewall shape to form sidewalls formed of the fifth insulating film; and forming a metal-semiconductor compound on the third diffusion layer.

As illustrated in FIGS. 16A to 16C, an impurity is introduced to form a third diffusion layer 127 in a lower portion of the first pillar-shaped silicon layer 111 and in a lower portion of the second pillar-shaped silicon layer 110. In order to form an n-type diffusion layer, arsenic or phosphorus is preferably introduced. In order to form a p-type diffusion layer, boron is preferably introduced. The diffusion layer may be formed after formation of sidewalls formed of a fifth insulating film described later on.

As illustrated in FIGS. 17A to 17C, a fifth insulating film 128 is formed around the third dummy gate 124 and the fourth dummy gate 123. The fifth insulating film 128 is preferably a nitride film.

Figure 18A:
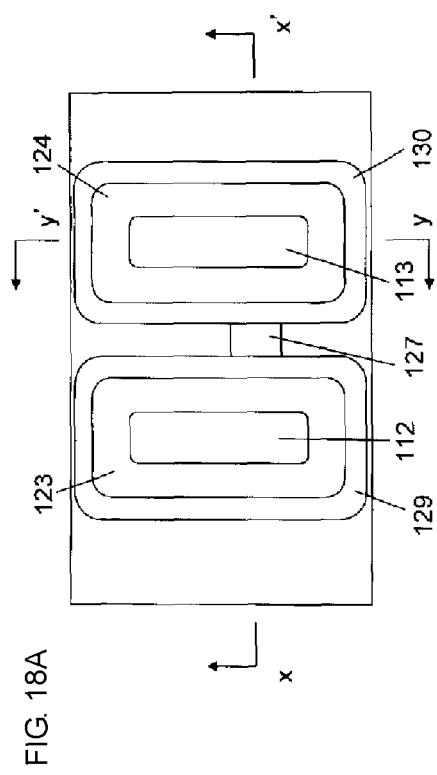
FIG. 18A is a plan view relating to a method for producing a semiconductor device according to an embodiment of the present invention.
Figure 18C:
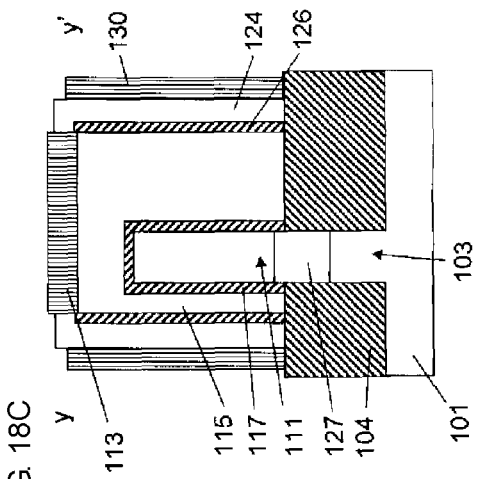
FIG. 18C is a sectional view taken along line Y-Y' in FIG. 18A.
Figure 18B:
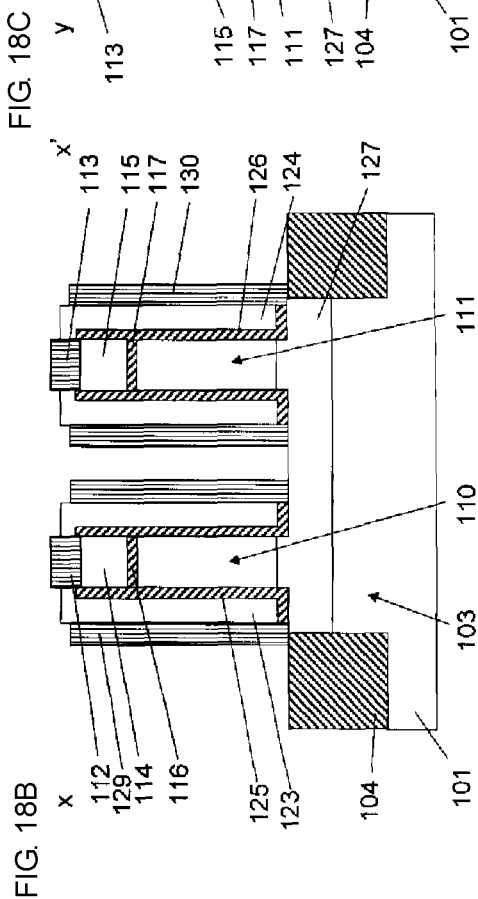
FIG. 18B is a sectional view taken along line X-X' in FIG. 18A.

As illustrated in FIGS. 18A to 18C, the fifth insulating film 128 is etched so as to have a sidewall shape to form sidewalls 130 and 129 formed of the fifth insulating film.

As illustrated in FIGS. 19A to 19C, a metal-semiconductor compound 131 is formed on the third diffusion layer 127. At this time, metal-semiconductor compounds 133 and 132 are also formed in an upper portion of the third dummy gate 124 and in an upper portion of the fourth dummy gate 125.

Thus, what has been described is the fourth step of forming a third diffusion layer in an upper portion of the fin-shaped semiconductor layer, in a lower portion of the first pillar-shaped semiconductor layer, and in a lower portion of the second pillar-shaped semiconductor layer; forming a fifth insulating film around the third dummy gate and the fourth dummy gate; etching the fifth insulating film so as to have a sidewall shape to form sidewalls formed of the fifth insulating film; and forming a metal-semiconductor compound on the third diffusion layer.

Next, the following is a description of a fifth step of, after the fourth step, depositing an interlayer insulating film and subjecting the interlayer insulating film to chemical mechanical polishing to expose upper portions of the first dummy gate, the second dummy gate, the third dummy gate, and the fourth dummy gate; removing the first dummy gate, the second dummy gate, the third dummy gate, and the fourth dummy gate; removing the second insulating film and the fourth insulating film; forming a first gate insulating film around the first pillar-shaped semiconductor layer, around the second pillar-shaped semiconductor layer, and on inner sides of the fifth insulating film; forming a fourth resist for removing the gate insulating film from around a bottom portion of the second pillar-shaped semiconductor layer; removing the first gate insulating film from around the bottom portion of the second pillar-shaped semiconductor layer; depositing a first metal; and subjecting the first metal to etch back to expose the upper portion of the first pillar-shaped semiconductor layer and the upper portion of the second pillar-shaped semiconductor layer, to form a gate electrode and a gate line around the first pillar-shaped semiconductor layer, and to form a contact electrode and a contact line around the second pillar-shaped semiconductor layer.

As illustrated in FIGS. 20A to 20C, an interlayer insulating film 134 is deposited. The interlayer insulating film 134 may be a contact stopper film.

As illustrated in FIGS. 21A to 21C, chemical mechanical polishing is performed to expose upper portions of the first dummy gate 115, the second dummy gate 114, the third dummy gate 124, and the fourth dummy gate 123. At this time, the metal-semiconductor compounds 133 and 132 in the upper portion of the third dummy gate 124 and in the upper portion of the fourth dummy gate 125 are also removed.

As illustrated in FIGS. 22A to 22C, the first dummy gate 115, the second dummy gate 114, the third dummy gate 124, and the fourth dummy gate 123 are removed.

As illustrated in FIGS. 23A to 23C, the second insulating films 117 and 116 and the fourth insulating films 126 and 125 are removed.

As illustrated in FIGS. 24A to 24C, a first gate insulating film 135 is formed around the first pillar-shaped silicon layer 111, around the second pillar-shaped silicon layer 110, and on inner sides of the fifth insulating films 130 and 129.

Figure 25A:
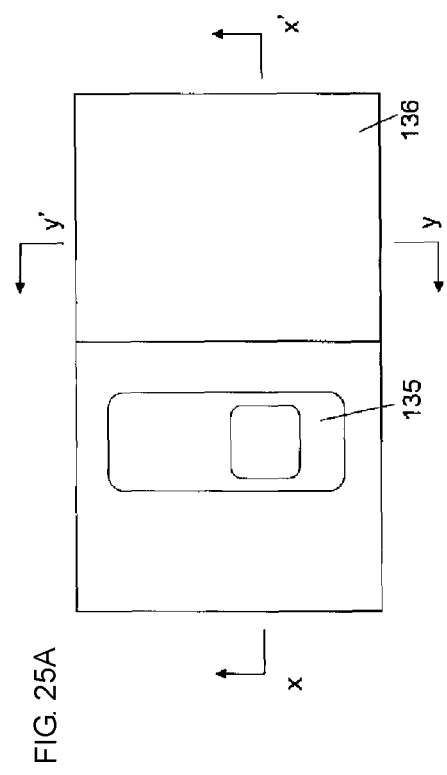
FIG. 25A is a plan view relating to a method for producing a semiconductor device according to an embodiment of the present invention.
Figure 25C:
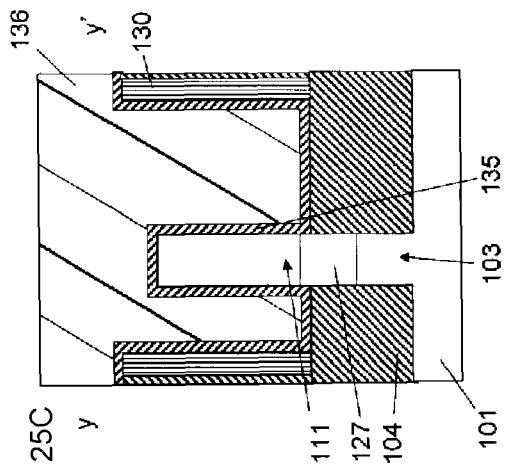
FIG. 25C is a sectional view taken along line Y-Y' in FIG. 25A.
Figure 25B:
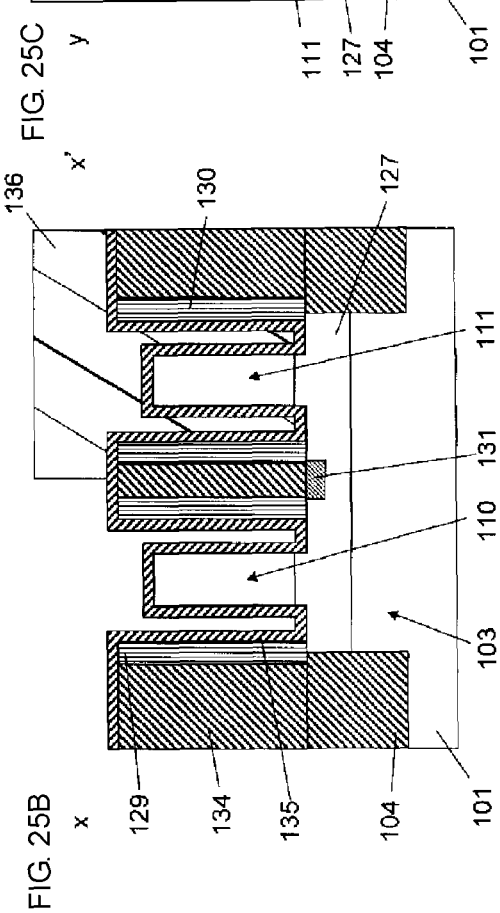
FIG. 25B is a sectional view taken along line X-X' in FIG. 25A.

As illustrated in FIGS. 25A to 25C, a fourth resist 136 for removing the first gate insulating film 135 from around a bottom portion of the second pillar-shaped silicon layer 110 is formed.

As illustrated in FIGS. 26A to 26C, the first gate insulating film 135 is removed from around the bottom portion of the second pillar-shaped silicon layer 110. The first gate insulating film is divided into first gate insulating films 137, 139, and 138. The first gate insulating films 137 and 139 may be removed by isotropic etching.

As illustrated in FIGS. 27A to 27C, the fourth resist 136 is removed.

As illustrated in FIGS. 28A to 28C, a first metal 140 is deposited.

As illustrated in FIGS. 29A to 29C, the first metal 140 is subjected to etch back to form a gate electrode 140a and a gate line 140b around the first pillar-shaped silicon layer 111 and to form a contact electrode 140c and a contact line 140d around the second pillar-shaped silicon layer 110. The length of the contact line may be short.

Thus, the method may include forming a gate insulating film around the first pillar-shaped semiconductor layer, around the second pillar-shaped semiconductor layer, and on inner sides of the fifth insulating film; subsequently forming a fourth resist for removing the first gate insulating film from around a bottom portion of the second pillar-shaped semiconductor layer; and removing the first gate insulating film from around the bottom portion of the second pillar-shaped semiconductor layer. As a result, a gate electrode and a gate line can be formed around the first pillar-shaped semiconductor layer and simultaneously a contact line and a contact electrode connected to an upper portion of a fin-shaped semiconductor layer can be formed around the second pillar-shaped semiconductor layer. Thus, the connection can be established by etching just for the thickness of the first gate insulating film, which eliminates the necessity of performing the step of forming deep contact holes.

The structure including a second pillar-shaped semiconductor layer and a contact electrode and a contact line that are formed around the second pillar-shaped semiconductor layer is the same as a transistor structure except that the layer is the same as a transistor structure except that the contact electrode is connected to the third diffusion layer. Thus, reduction in the number of steps can be achieved.

Thus, what has been described is the fifth step of, after the fourth step, depositing an interlayer insulating film and subjecting the interlayer insulating film to chemical mechanical polishing to expose upper portions of the first dummy gate, the second dummy gate, the third dummy gate, and the fourth dummy gate; removing the first dummy gate, the second dummy gate, the third dummy gate, and the fourth dummy gate; removing the second insulating film and the fourth insulating film; forming a first gate insulating film around the first pillar-shaped semiconductor layer, around the second pillar-shaped semiconductor layer, and on inner sides of the fifth insulating film; forming a fourth resist for removing the gate insulating film from around a bottom portion of the second pillar-shaped semiconductor layer; removing the first gate insulating film from around the bottom portion of the second pillar-shaped semiconductor layer; depositing a first metal; and subjecting the first metal to etch back to expose the upper portion of the first pillar-shaped semiconductor layer and the upper portion of the second pillar-shaped semiconductor layer, to form a gate electrode and a gate line around the first pillar-shaped semiconductor layer, and to form a contact electrode and a contact line around the second pillar-shaped semiconductor layer.

Next, the following is a description of a sixth step of, after the fifth step, depositing a second gate insulating film around the first pillar-shaped semiconductor layer, on the gate electrode, on the gate line, around the second pillar-shaped semiconductor layer, on the contact electrode, and on the contact line; removing a portion of the second gate insulating film on the gate line and at least portions of the second gate insulating film on the contact electrode and on the contact line; depositing a second metal; exposing an upper portion of the first pillar-shaped semiconductor layer and an upper portion of the second pillar-shaped semiconductor layer; removing the second gate insulating film on the first pillar-shaped semiconductor layer; depositing a third metal; etching a portion of the third metal and a portion of the second metal to form a first contact in which the second metal surrounds an upper side wall of the first pillar-shaped semiconductor layer, to form a second contact that connects an upper portion of the first contact to an upper portion of the first pillar-shaped semiconductor layer, to form a third contact formed of the second metal and the third metal formed on the gate line, to form a fourth contact in which the second metal surrounds an upper side wall of the second pillar-shaped semiconductor layer and is connected to the contact electrode, and to form a fifth contact that connects an upper portion of the fourth contact to an upper portion of the second pillar-shaped semiconductor layer.

After the fifth step, holes having the same shapes as the gate electrode and the gate line are left above the gate electrode and the gate line. Also, holes having the same shapes as the contact electrode and the contact line are left above the contact electrode and the contact line. In this case, the exposed first gate insulating film is removed; a second gate insulating film is deposited around the first pillar-shaped semiconductor layer, on the gate electrode, on the gate line, around the second pillar-shaped semiconductor layer, on the contact electrode, and on the contact line; a portion of the second gate insulating film on the gate line and at least portions of the second gate insulating film on the contact electrode and on the contact line are removed; a second metal is deposited and subjected to etch back. As a result, the holes having the same shapes as the gate electrode and the gate line and the holes having the same shapes as the contact electrode and the contact line are filled with the metal, to thereby form, by self alignment, a first contact in which the second metal surrounds an upper side wall of the first pillar-shaped semiconductor layer and a fourth contact in which the second metal surrounds an upper side wall of the second pillar-shaped semiconductor layer and is connected to the contact electrode.

As illustrated in FIGS. 30A to 30C, the exposed first gate insulating films 139, 137, and 138 are removed.

Figure 31A:
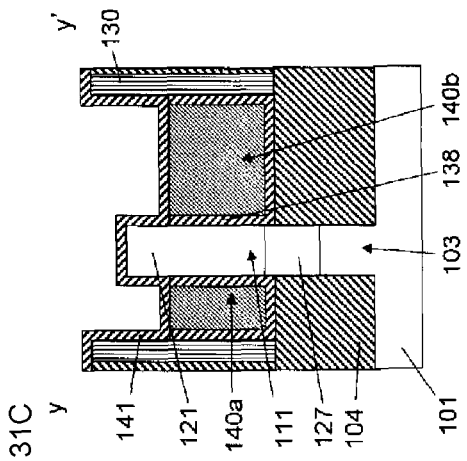
FIG. 31A is a plan view relating to a method for producing a semiconductor device according to an embodiment of the present invention.
Figure 31B:
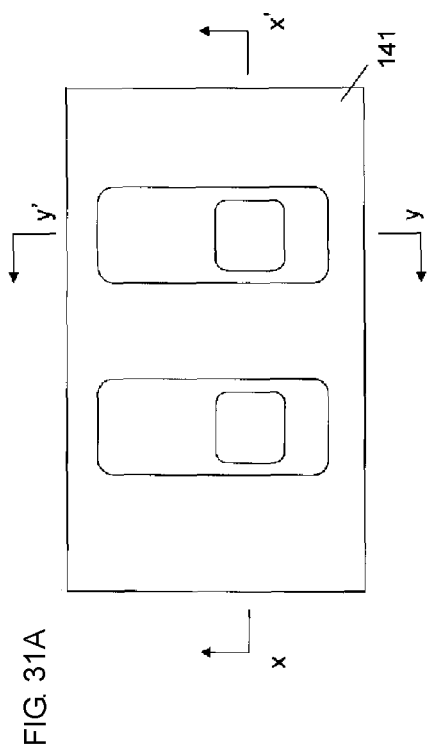
FIG. 31B is a sectional view taken along line X-X' in FIG. 31A.
Figure 31C:
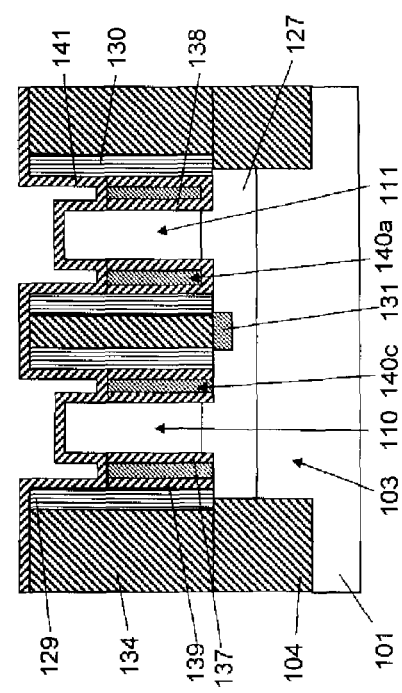
FIG. 31C is a sectional view taken along line Y-Y' in FIG. 31A.

As illustrated in FIGS. 31A to 31C, a second gate insulating film 141 is deposited around the first pillar-shaped silicon layer 111, on the gate electrode 140a, on the gate line 140b, around the second pillar-shaped silicon layer 110, on the contact electrode 140c, and on the contact line 140d.

As illustrated in FIGS. 32A to 32C, a fifth resist 142 is formed for removing a portion of the second gate insulating film 141 on the gate line 140b and at least portions of the second gate insulating film 141 on the contact electrode 140c and on the contact line 140d.

As illustrated in FIGS. 33A to 33C, a portion of the second gate insulating film 141 on the gate line 140b and at least portions of the second gate insulating film 141 on the contact electrode 140c and on the contact line 140d are removed. Thus, the second gate insulating film 141 is divided into second gate insulating films 143, 144, and 145. The second gate insulating films 143 and 144 may be removed by isotropic etching.

Since the portion of the second gate insulating film on the gate line is removed, a third contact for the gate line can be simultaneously formed, which facilitates formation of the contact for the gate line.

Accordingly, the contact can be formed by etching just for the thickness of the first gate insulating film and the thickness of the second gate insulating film, which eliminates the necessity of performing the step of forming a deep contact hole.

As illustrated in FIGS. 34A to 34C, the fifth resist 142 is removed.

As illustrated in FIGS. 35A to 35C, second metals 146 and 147 are deposited and subjected to etch back to expose an upper portion of the first pillar-shaped silicon layer 111 and an upper portion of the second pillar-shaped silicon layer 110. In a case where the transistor is an n-type transistor, the second metals 146 and 147 preferably have a work function of 4.0 eV to 4.2 eV. In a case where the transistor is a p-type transistor, the second metals 146 and 147 preferably have a work function of 5.0 eV to 5.2 eV.

As illustrated in FIGS. 36A to 36C, the second gate insulating film 145 is removed from the exposed upper portion of the first pillar-shaped silicon layer 111.

As illustrated in FIGS. 37A to 37C, third metals 148 and 149 are deposited. The third metals may be the same metals as the second metals.

As illustrated in FIGS. 38A to 38C, a fourth metal 150 for metal wirings is deposited.

As illustrated in FIGS. 39A to 39C, sixth resists 151, 152, and 153 are formed for forming metal wirings and etching portions of the third metals 148 and 149 and the second metals 146 and 147.

As illustrated in FIGS. 40A to 40C, the fourth metal 150 is etched to form metal wirings 154, 155, and 156. Portions of the third metals 148 and 149 and the second metals 146 and 147 are etched to form a first contact 147a in which the second metal 147 surrounds an upper side wall of the first pillar-shaped silicon layer 111, to form a second contact 149a that connects an upper portion of the first contact 147a to an upper portion of the first pillar-shaped silicon layer 111, to form a third contact 157 including the second metal 147b and the third metal 149b formed on the gate line 140b, to form a fourth contact 146 in which the second metal surrounds an upper side wall of the second pillar-shaped semiconductor layer and is connected to the contact electrode, and to form a fifth contact 148 that connects an upper portion of the fourth contact 146 to an upper portion of the second pillar-shaped silicon layer 110. Before the metal wirings are formed, portions of the third metals 148 and 149 and the second metals 146 and 147 may be etched.

As illustrated in FIGS. 41A to 41C, the sixth resists 151, 152, and 153 are removed.

Thus, what has been described is the sixth step of, after the fifth step, depositing a second gate insulating film around the first pillar-shaped semiconductor layer, on the gate electrode, on the gate line, around the second pillar-shaped semiconductor layer, on the contact electrode, and on the contact line; removing a portion of the second gate insulating film on the gate line and at least portions of the second gate insulating film on the contact electrode and on the contact line; depositing a second metal; exposing an upper portion of the first pillar-shaped semiconductor layer and an upper portion of the second pillar-shaped semiconductor layer; removing the second gate insulating film on the first pillar-shaped semiconductor layer; depositing a third metal; etching a portion of the third metal and a portion of the second metal to form a first contact in which the second metal surrounds an upper side wall of the first pillar-shaped semiconductor layer, to form a second contact that connects an upper portion of the first contact to an upper portion of the first pillar-shaped semiconductor layer, to form a third contact formed of the second metal and the third metal formed on the gate line, to form a fourth contact in which the second metal surrounds an upper side wall of the second pillar-shaped semiconductor layer and is connected to the contact electrode, and to form a fifth contact that connects an upper portion of the fourth contact to an upper portion of the second pillar-shaped semiconductor layer.

Thus, what has been described is a method for producing an SGT by a gate-last process in which a gate electrode and a gate line are formed around a first pillar-shaped semiconductor layer and simultaneously a contact line and a contact electrode connected to an upper portion of a fin-shaped semiconductor layer are formed around a second pillar-shaped semiconductor layer, the SGT having a structure in which upper portions of pillar-shaped semiconductor layers formed by self alignment function as an n-type semiconductor layer or a p-type semiconductor layer due to a work-function difference between metal and semiconductor.

FIGS. 1A to 1C illustrate the structure of a semiconductor device obtained by the above-described production method.

The semiconductor device includes a fin-shaped silicon layer 103 formed on a silicon substrate 101, a first insulating film 104 formed around the fin-shaped silicon layer 103, a second pillar-shaped silicon layer 110 formed on the fin-shaped silicon layer 103, a contact electrode 140c formed of metal and formed around the second pillar-shaped silicon layer 110, a contact line 140d formed of metal and extending in a direction orthogonal to the fin-shaped silicon layer 103 connected to the contact electrode 140c, a third diffusion layer 127 formed in an upper portion of the fin-shaped silicon layer 103 and in a lower portion of the second pillar-shaped silicon layer 110, the contact electrode 140c being connected to the third diffusion layer 127, a fourth contact 146 surrounding an upper side wall of the second pillar-shaped silicon layer 110 and being connected to the contact electrode 140c, and a fifth contact 148 connecting an upper portion of the fourth contact 146 to an upper portion of the second pillar-shaped silicon layer 110.

The semiconductor device includes a first gate insulating film 137 formed between the second pillar-shaped silicon layer 110 and the contact electrode 140c.

The semiconductor device includes a second gate insulating film 143 formed between an upper side wall of the second pillar-shaped silicon layer 110 and the fourth contact 146.

In the semiconductor device, the width of the second pillar-shaped silicon layer 110 in a direction orthogonal to the fin-shaped silicon layer 103 is the same as the width of the fin-shaped silicon layer 103 in the direction orthogonal to the fin-shaped silicon layer 103.

The semiconductor device further includes the first gate insulating film 139 formed around the contact electrode 140c and the contact line 140d.

In the semiconductor device, the width of the contact electrode 140c in a direction orthogonal to the contact line 140d is the same as the width of the contact line 140d in the direction orthogonal to the contact line 140d.

In the semiconductor device, the width of the fourth contact 146 in the direction orthogonal to the contact line 140d is the same as the width of the contact electrode 140c in the direction orthogonal to the contact line 140d.

In the semiconductor device, the width of the fifth contact 148 in the direction orthogonal to the contact line 140d is the same as the width of the fourth contact 146 in the direction orthogonal to the contact line 140d.

The semiconductor device further includes the fin-shaped silicon layer 103 formed on the silicon substrate 101, the first insulating film 104 formed around the fin-shaped silicon layer 103, a first pillar-shaped silicon layer 111 formed on the fin-shaped silicon layer 103, the first gate insulating film 138 further formed around the first pillar-shaped silicon layer 111, a gate electrode 140a formed of metal and formed around the first gate insulating film 138, a gate line 140b formed of metal and extending in a direction orthogonal to the fin-shaped silicon layer 103 connected to the gate electrode 140a, the first gate insulating film 138 formed around and below the gate electrode 140a and the gate line 140b, the gate electrode 140a having a width in a direction orthogonal to the gate line 140b, the width being the same as the width of the gate line 140b in the direction orthogonal to the gate line 140b, the third diffusion layer 127 being formed in an upper portion of the fin-shaped silicon layer 103 and in a lower portion of the first pillar-shaped silicon layer 111, the second gate insulating film 145 formed around an upper side wall of the first pillar-shaped silicon layer 111, a first contact 147a formed of a second metal and formed around the second gate insulating film 145, a second contact 149a formed of a third metal and connecting an upper portion of the first contact 147a to an upper portion of the first pillar-shaped silicon layer 111, and a third contact 157 formed of the second metal 147b and the third metal 149b formed on the gate line 140b.

In a case where the transistor is an n-type transistor, the second metal of the first contact 147a preferably has a work function of 4.0 eV to 4.2 eV. In a case where the transistor is a p-type transistor, the second metals 146 and 147 preferably have a work function of 5.0 eV to 5.2 eV.

This structure including the second pillar-shaped silicon layer 110, the contact electrode 140c and the contact line 140d formed around the second pillar-shaped silicon layer 110, the fourth contact 146 surrounding an upper side wall of the second pillar-shaped silicon layer 110 and being connected to the contact electrode 140c, and the fifth contact 148 connecting an upper portion of the fourth contact 146 to an upper portion of the second pillar-shaped silicon layer 110 is the same as a transistor structure except that the contact electrode is connected to the third diffusion layer and the fourth contact 146 is connected to the contact electrode. Thus, reduction in the number of steps can be achieved.

Note that the present invention encompasses various embodiments and modifications without departing from the broad spirit and scope of the present invention. The above-described embodiments are used to describe examples of the present invention and do not limit the technical scope of the present invention.

For example, a method for producing a semiconductor device in which the p-type (including $p^+$ type) and the n-type (including $n^+$ type) in the above-described embodiment are changed to the opposite conductivity types and a semiconductor device produced by this method are obviously within the technical scope of the present invention.

The invention claimed is:

1. A method for producing a semiconductor device, comprising:
    a first step of forming a fin-shaped semiconductor layer on a semiconductor substrate and forming a first insulating film around the fin-shaped semiconductor layer;
    a second step of, after the first step, forming a first pillar-shaped semiconductor layer, a first dummy gate formed from a first polysilicon, a second pillar-shaped semiconductor layer, and a second dummy gate formed from the first polysilicon;
    a third step of, after the second step, forming a third dummy gate and a fourth dummy gate on side walls of the first dummy gate, the first pillar-shaped semiconductor layer, the second dummy gate, and the second pillar-shaped semiconductor layer;
    a fourth step of, after the third step, forming a third diffusion layer in an upper portion of the fin-shaped semiconductor layer, in a lower portion of the first pillar-shaped semiconductor layer, and in a lower portion of the second pillar-shaped semiconductor layer;
    a fifth step of, after the fourth step, depositing an interlayer insulating film; exposing upper portions of the first dummy gate, the second dummy gate, the third dummy gate, and the fourth dummy gate; removing the first dummy gate, the second dummy gate, the third dummy gate, and the fourth dummy gate; forming a first gate insulating film around the first pillar-shaped semiconductor layer and around the second pillar-shaped semiconductor layer; removing the first gate insulating film from around a bottom portion of the second pillar-shaped semiconductor layer; depositing a first metal; exposing an upper portion of the first pillar-shaped semiconductor layer and an upper portion of the second pillar-shaped semiconductor layer; forming a gate electrode and a gate line around the first pillar-shaped semiconductor layer; and forming a contact electrode and a contact line around the second pillar-shaped semiconductor layer; and
    a sixth step of, after the fifth step, depositing a second gate insulating film around the first pillar-shaped semiconductor layer, on the gate electrode, on the gate line, around the second pillar-shaped semiconductor layer, on the contact electrode, and on the contact line; removing a portion of the second gate insulating film on the gate line and at least portions of the second gate insulating film on the contact electrode and on the contact line; depositing a second metal; exposing an upper portion of the first pillar-shaped semiconductor layer and an upper portion of the second pillar-shaped semiconductor layer; removing the second gate insulating film on the first pillar-shaped semiconductor layer; depositing a third metal; etching a portion of the third metal and a portion of the second metal to form a first contact in which the second metal surrounds an upper side wall of the first pillar-shaped semiconductor layer, to form a second contact that connects an upper portion of the first contact to an upper portion of the first pillar-shaped semiconductor layer, to form a third contact formed of the second metal and the third metal formed on the gate line, to form a fourth contact in which the second metal surrounds an upper side wall of the second pillar-shaped semiconductor layer and is connected to the contact electrode, and to form a fifth contact that connects an upper portion of the fourth contact to an upper portion of the second pillar-shaped semiconductor layer.

2. The method for producing a semiconductor device according to claim 1, wherein, in the second step,
a second insulating film is formed around the fin-shaped semiconductor layer,
the first polysilicon is deposited on the second insulating film to achieve planarization,
a second resist for forming a first gate line and the first pillar-shaped semiconductor layer and a third resist for forming a first contact line and the second pillar-shaped semiconductor layer are formed in a direction perpendicular to a direction of the fin-shaped semiconductor layer, and
the first polysilicon, the second insulating film, and the fin-shaped semiconductor layer are etched to form the first pillar-shaped semiconductor layer, the first dummy gate formed from the first polysilicon, the second pillar-shaped semiconductor layer, and the second dummy gate formed from the first polysilicon.

3. The method for producing a semiconductor device according to claim 2, wherein, after the first polysilicon is deposited on the second insulating film to achieve planarization, a third insulating film is further formed on the first polysilicon.

4. The method for producing a semiconductor device according to claim 2, wherein, after the second step, in the third step, a fourth insulating film is formed around the first pillar-shaped semiconductor layer, the second pillar-shaped semiconductor layer, the first dummy gate, and the second dummy gate; a second polysilicon is deposited around the fourth insulating film; and the second polysilicon is etched so as to remain on side walls of the first dummy gate, the first pillar-shaped semiconductor layer, the second dummy gate, and the second pillar-shaped semiconductor layer to form the third dummy gate and the fourth dummy gate.

5. The method for producing a semiconductor device according to claim 4, wherein, in the fourth step, the third diffusion layer is formed in the upper portion of the fin-shaped semiconductor layer, in the lower portion of the first pillar-shaped semiconductor layer, and in the lower portion of the second pillar-shaped semiconductor layer; a fifth insulating film is formed around the third dummy gate and the fourth dummy gate; the fifth insulating film is etched so as to have a sidewall shape to form sidewalls formed of the fifth insulating film; and a metal-semiconductor compound is formed on the third diffusion layer.

6. The method for producing a semiconductor device according to claim 5, wherein, after the fourth step, in the fifth step, the interlayer insulating film is deposited and subjected to chemical mechanical polishing to expose upper portions of the first dummy gate, the second dummy gate, the third dummy gate, and the fourth dummy gate; the first dummy gate, the second dummy gate, the third dummy gate, and the fourth dummy gate are removed; the second insulating film and the fourth insulating film are removed; the first gate insulating film is formed around the first pillar-shaped semiconductor layer, around the second pillar-shaped semiconductor layer, and on inner sides of the fifth insulating film; a fourth resist for removing the gate insulating film from around a bottom portion of the second pillar-shaped semiconductor layer is formed; the first gate insulating film is removed from around the bottom portion of the second pillar-shaped semiconductor layer; the first metal is deposited; and the first metal is subjected to etch back to expose the upper portion of the first pillar-shaped semiconductor layer and the upper portion of the second pillar-shaped semiconductor layer, to form the gate electrode and the gate line around the first pillar-shaped semiconductor layer, and to form the contact electrode and the contact line around the second pillar-shaped semiconductor layer.

* * * * *